United States Patent
Kunitani et al.

(10) Patent No.: US 8,470,195 B2
(45) Date of Patent: Jun. 25, 2013

(54) CHEMICAL MECHANICAL POLISHING AQUEOUS DISPERSION PREPARATION SET, METHOD OF PREPARING CHEMICAL MECHANICAL POLISHING AQUEOUS DISPERSION, CHEMICAL MECHANICAL POLISHING AQUEOUS DISPERSION, AND CHEMICAL MECHANICAL POLISHING METHOD

(75) Inventors: Eiichirou Kunitani, Yokkaichi (JP); Hirotaka Shida, Yokkaichi (JP); Kazuhito Uchikura, Yokkaichi (JP)

(73) Assignee: JSR Corporation, Tokyo (JP)

( * ) Notice: Subject to any disclaimer, the term of this patent is extended or adjusted under 35 U.S.C. 154(b) by 1413 days.

(21) Appl. No.: 12/127,334

(22) Filed: May 27, 2008

(65) Prior Publication Data

US 2008/0318427 A1    Dec. 25, 2008

(30) Foreign Application Priority Data

Jun. 19, 2007   (JP) ................................. 2007-160892

(51) Int. Cl.
*H01L 21/304* (2006.01)
*C09K 13/00* (2006.01)
*C09K 13/02* (2006.01)

(52) U.S. Cl.
USPC ................. 252/79.1; 252/79.5; 257/E21.214; 257/E21.304; 438/693

(58) Field of Classification Search
None
See application file for complete search history.

(56) References Cited

U.S. PATENT DOCUMENTS

| | | | |
|---|---|---|---|
| 6,582,761 B1 * | 6/2003 | Nishimoto et al. | 427/203 |
| 6,786,944 B2 * | 9/2004 | Hattori et al. | 51/307 |
| 6,821,897 B2 * | 11/2004 | Schroeder et al. | 438/692 |
| 6,935,928 B2 * | 8/2005 | Uchikura et al. | 451/36 |
| 7,183,211 B2 | 2/2007 | Konno et al. | |
| 7,319,072 B2 * | 1/2008 | Kurata et al. | 438/690 |
| 7,367,870 B2 * | 5/2008 | Kurata et al. | 451/36 |
| 7,544,307 B2 * | 6/2009 | Akatsuka | 252/79 |
| 7,547,335 B2 * | 6/2009 | Seki et al. | 51/307 |
| 7,744,666 B2 * | 6/2010 | Kurata et al. | 51/306 |
| 7,799,688 B2 * | 9/2010 | Kurata et al. | 438/692 |
| 7,820,068 B2 * | 10/2010 | Wang et al. | 252/79.1 |
| 7,842,193 B2 * | 11/2010 | Takenouchi | 252/79.4 |
| 7,857,985 B2 * | 12/2010 | Yamashita et al. | 216/89 |
| 8,075,800 B2 * | 12/2011 | Koyama et al. | 252/79.1 |
| 8,083,964 B2 * | 12/2011 | Yamada et al. | 216/88 |
| 8,157,877 B2 * | 4/2012 | Ikeda et al. | 51/309 |
| 2003/0124959 A1 * | 7/2003 | Schroeder et al. | 451/41 |
| 2003/0196386 A1 * | 10/2003 | Hattori et al. | 51/307 |
| 2004/0007690 A1 * | 1/2004 | Snider et al. | 252/79.1 |
| 2004/0021125 A1 | 2/2004 | Taiji et al. | |

(Continued)

FOREIGN PATENT DOCUMENTS

| EP | 1 568 746 A1 | 8/2005 |
|---|---|---|
| EP | 1 700 893 A1 | 9/2006 |

(Continued)

*Primary Examiner* — Allan Olsen
(74) *Attorney, Agent, or Firm* — Oblon, Spivak, McClelland, Maier & Neustadt, L.L.P.

(57) ABSTRACT

A chemical mechanical polishing aqueous dispersion preparation set including: a first composition which includes colloidal silica having an average primary particle diameter of 15 to 40 nm and a basic compound and has a pH of 8.0 to 11.0; and a second composition which includes poly(meth)acrylic acid and an organic acid having two or more carbonyl groups other than the poly(meth)acrylic acid and has a pH of 1.0 to 5.0.

14 Claims, 2 Drawing Sheets

U.S. PATENT DOCUMENTS

| | | | |
|---|---|---|---|
| 2004/0065021 A1* | 4/2004 | Yoneda et al. | 51/298 |
| 2004/0077757 A1* | 4/2004 | Araki et al. | 524/264 |
| 2004/0186206 A1* | 9/2004 | Yoneda et al. | 524/95 |
| 2004/0209555 A1* | 10/2004 | Sun et al. | 451/41 |
| 2005/0037693 A1* | 2/2005 | Uchikura et al. | 451/41 |
| 2005/0173669 A1* | 8/2005 | Kurata et al. | 252/79.1 |
| 2005/0181609 A1* | 8/2005 | Kurata et al. | 438/689 |
| 2006/0000808 A1* | 1/2006 | Seki et al. | 216/88 |
| 2006/0037251 A1* | 2/2006 | Kurata et al. | 51/298 |
| 2006/0096179 A1* | 5/2006 | Lu et al. | 51/307 |
| 2006/0115973 A1* | 6/2006 | Seki et al. | 438/600 |
| 2006/0124597 A1* | 6/2006 | Kurata et al. | 216/88 |
| 2006/0186089 A1 | 8/2006 | Shida et al. | |
| 2006/0201914 A1* | 9/2006 | Uchikura et al. | 216/88 |
| 2006/0214133 A1* | 9/2006 | Yamashita | 252/186.1 |
| 2006/0276041 A1* | 12/2006 | Uchikura et al. | 438/692 |
| 2006/0289826 A1* | 12/2006 | Koyama et al. | 252/79.1 |
| 2007/0037491 A1* | 2/2007 | Li et al. | 451/41 |
| 2007/0049180 A1* | 3/2007 | Shida et al. | 451/41 |
| 2007/0066065 A1* | 3/2007 | Sugiyama | 438/691 |
| 2007/0068086 A1* | 3/2007 | Akatsuka | 51/307 |
| 2007/0093187 A1* | 4/2007 | Takenouchi | 451/174 |
| 2007/0175104 A1* | 8/2007 | Nishiyama et al. | 51/307 |
| 2007/0176142 A1* | 8/2007 | Kikuchi | 252/79.1 |
| 2007/0181534 A1* | 8/2007 | Kamimura | 216/88 |
| 2007/0186484 A1* | 8/2007 | Yamashita et al. | 51/308 |
| 2007/0218811 A1* | 9/2007 | Kurata et al. | 451/28 |
| 2007/0295934 A1* | 12/2007 | Kurata et al. | 252/79.1 |
| 2008/0003924 A1* | 1/2008 | Kurata et al. | 451/36 |
| 2008/0034670 A1* | 2/2008 | Li et al. | 51/298 |
| 2008/0197112 A1* | 8/2008 | Wang et al. | 216/89 |
| 2008/0206995 A1* | 8/2008 | Tomiga et al. | 438/693 |
| 2008/0237535 A1* | 10/2008 | Maejima et al. | 252/79.1 |
| 2008/0242090 A1* | 10/2008 | Yamada et al. | 438/692 |
| 2008/0254717 A1* | 10/2008 | Fukasawa et al. | 451/36 |
| 2008/0265205 A1 | 10/2008 | Oh | |
| 2009/0124172 A1* | 5/2009 | Uchikura et al. | 451/36 |
| 2009/0221213 A1 | 9/2009 | Namie et al. | |
| 2009/0291620 A1 | 11/2009 | Kunitani et al. | |
| 2009/0302266 A1* | 12/2009 | Takemura et al. | 252/79.1 |
| 2009/0325383 A1 | 12/2009 | Andou et al. | |
| 2010/0075501 A1 | 3/2010 | Abe et al. | |
| 2010/0099260 A1 | 4/2010 | Matsumoto et al. | |
| 2010/0210109 A1* | 8/2010 | Fukasawa et al. | 438/692 |
| 2010/0221918 A1 | 9/2010 | Takemura et al. | |
| 2010/0252774 A1 | 10/2010 | Shida et al. | |
| 2010/0301265 A1* | 12/2010 | Kurata et al. | 252/79.2 |
| 2011/0053462 A1 | 3/2011 | Shida et al. | |
| 2011/0059680 A1 | 3/2011 | Motonari et al. | |
| 2011/0081780 A1 | 4/2011 | Shida et al. | |
| 2011/0117821 A1 | 5/2011 | Nishimoto et al. | |
| 2011/0250756 A1 | 10/2011 | Uchikura et al. | |

FOREIGN PATENT DOCUMENTS

| | | |
|---|---|---|
| EP | 1 724 317 A1 | 11/2006 |
| JP | 2003-289055 | 10/2003 |
| JP | 2004-335896 A | 11/2004 |
| JP | 2006-287207 A | 10/2006 |
| WO | 2007/026862 A1 | 3/2007 |

* cited by examiner

CHEMICAL MECHANICAL POLISHING AQUEOUS DISPERSION PREPARATION SET, METHOD OF PREPARING CHEMICAL MECHANICAL POLISHING AQUEOUS DISPERSION, CHEMICAL MECHANICAL POLISHING AQUEOUS DISPERSION, AND CHEMICAL MECHANICAL POLISHING METHOD

Japanese Patent Application No. 2007-160892, filed on Jun. 19, 2007, is hereby incorporated by reference in its entirety.

BACKGROUND OF THE INVENTION

The present invention relates to a chemical mechanical polishing aqueous dispersion preparation set, a method of preparing a chemical mechanical polishing aqueous dispersion, a chemical mechanical polishing aqueous dispersion, and a chemical mechanical polishing method.

In recent years, planarization technology utilizing chemical mechanical polishing has attracted attention along with an increase in the degree of integration of semiconductor devices and development of multi-layer interconnect technology. A chemical mechanical polishing aqueous dispersion used for chemical mechanical polishing normally contains abrasive grains as an abrasive agent. Various abrasive grains have been proposed. Examples of the abrasive grains include inorganic particles such as fumed silica, colloidal silica, alumina, and cerium oxide, organic particles such as polymethyl methacrylate, organic-inorganic composite particles prepared by physically or chemically bonding inorganic particles and organic particles, and the like (see JP-A-2003-289055, for example).

A chemical mechanical polishing aqueous dispersion optionally contains various components such as an oxidizing agent, an organic acid, and a surfactant in addition to abrasive grains. A related-art chemical mechanical polishing aqueous dispersion has a problem in that abrasive grains aggregate during long-term storage due to poor dispersion stability of the abrasive grains, for example. A chemical mechanical polishing aqueous dispersion in which abrasive grains aggregate and precipitate affects chemical mechanical polishing performance. For example, an interconnect portion may be polished to a large extent so that a depression referred to as dishing or erosion may occur. A surface defect referred to as a scratch or the like may also occur.

A chemical mechanical polishing aqueous dispersion with constant quality cannot be provided if the abrasive grains aggregate. In particular, such a problem occurs to a large extent when providing a chemical mechanical polishing aqueous dispersion in a concentrated state. Therefore, an improvement has been desired.

SUMMARY

An object of the invention is to provide a method of preparing a chemical mechanical polishing aqueous dispersion which can reduce surface defects such as dishing, erosion, scratches, and fangs during planarization of a polishing target surface utilizing chemical mechanical polishing, and a chemical mechanical polishing aqueous dispersion preparation set which exhibits excellent long-term storage stability in a concentrated state.

"Fangs" are one of problems to be solved by this invention and will be described in detail below.

Fangs tend to occur when a metal layer is formed of copper or a copper alloy. Specifically, the term "fang" refers to a groove-shaped defect which occurs in a semiconductor device due to chemical mechanical polishing at the interface between an area including a minute copper or copper alloy interconnect and an area other than the copper or copper alloy interconnect.

Specifically, when a component contained in a chemical mechanical polishing aqueous dispersion is non-uniformly accumulated at the interface between an area including a minute copper or copper alloy interconnect and an area other than the copper or copper alloy interconnect, an area around the interface may be polished to a large extent, whereby a fang may occur. For example, when abrasive grains contained in a chemical mechanical polishing aqueous dispersion are present at a high concentration near the interface between an area including a minute copper or copper alloy interconnect and an area (field area) other than the copper or copper alloy interconnect, the polishing rate locally increases at the interface, whereby an area around the interface may be polished to a large extent. This phenomenon is observed as a spike-shaped defect. This spike-shaped defect is referred to as a fang.

Fangs occur due to various causes depending on the interconnect pattern. The cause of fangs to be eliminated by the invention is described in detail below using a workpiece 100 shown in FIGS. 1A to 1D as an example.

As shown in FIG. 1A, the workpiece 100 has a configuration including an insulating layer 12 in which interconnect depressions 20 (e.g., grooves) are formed, a barrier layer 14 provided to cover the surface of the insulating layer 12 and the bottom and the inner wall surface of the interconnect depressions 20, and a copper or copper alloy layer 16 which is provided in the interconnect depressions 20 and is formed on the barrier layer 14, these layers being stacked on a substrate 10. The workpiece 100 includes an area 22 in which minute copper or copper alloy interconnects are formed, and an area 24 in which minute copper or copper alloy interconnects are not formed. As shown in FIG. 1A, a copper or copper alloy depression tends to be formed in the area 22 in which minute interconnects are formed.

FIG. 1B shows a state after the copper or the copper alloy layer 16 has been subjected to chemical mechanical polishing until the barrier layer 14 is observed. A fang is not observed in this state.

FIG. 1C shows a state after the barrier layer 14 has been removed by chemical mechanical polishing until the insulating layer 12 is observed. A minute scratch 26 may occur as a result of chemical mechanical polishing at the interface between the area 22 in which minute copper or copper alloy interconnects are formed and the area 24 in which minute copper or copper alloy interconnects are not formed.

FIG. 1D shows a state after the insulating layer 12 has been further removed by chemical mechanical polishing. As shown in FIG. 1D, the minute scratch 26 has been enlarged to a groove-shaped fang 28.

Such a fang may adversely affect the resulting semiconductor device and decrease yield.

According to a first aspect of the invention, there is provided a chemical mechanical polishing aqueous dispersion preparation set comprising:

a first composition which includes colloidal silica having an average primary particle diameter of 15 to 40 nm and a basic compound and has a pH of 8.0 to 11.0; and a second composition which includes poly(meth)acrylic acid and an organic acid having two or more carbonyl groups other than the poly(meth)acrylic acid and has a pH of 1.0 to 5.0.

In this chemical mechanical polishing aqueous dispersion preparation set, the organic acid having two or more carbonyl groups may have a pKa value of three or less.

In this chemical mechanical polishing aqueous dispersion preparation set, the organic acid having two or more carbonyl groups may be at least one organic acid selected from maleic acid, quinolinic acid, and citric acid.

In this chemical mechanical polishing aqueous dispersion preparation set, the basic compound may be potassium hydroxide or ammonia.

In this chemical mechanical polishing aqueous dispersion preparation set, at least one of the first composition and the second composition may include benzotriazole.

The chemical mechanical polishing aqueous dispersion preparation set may further include a third composition which includes at least an oxidizing agent.

According to a second aspect of the invention, there is provided a method of preparing a chemical mechanical polishing aqueous dispersion comprising:

mixing a first composition which includes colloidal silica having an average primary particle diameter of 15 to 40 nm and a basic compound and has a pH of 8.0 to 11.0 with a second composition which includes poly(meth)acrylic acid and an organic acid having two or more carbonyl groups other than the poly(meth)acrylic acid and has a pH of 1.0 to 5.0 to prepare a chemical mechanical polishing aqueous dispersion having a pH of 3.5 to 6.0.

In this method of preparing a chemical mechanical polishing aqueous dispersion, the mass ratio (PA/OA) of the mass (PA) of the poly(meth)acrylic acid to the mass (OA) of the organic acid having two or more carbonyl groups included in the chemical mechanical polishing aqueous dispersion may be 0.2 to 5.0.

In this method of preparing a chemical mechanical polishing aqueous dispersion, the organic acid having two or more carbonyl groups may have a pKa value of three or less.

In this method of preparing a chemical mechanical polishing aqueous dispersion, the organic acid having two or more carbonyl groups may be at least one organic acid selected from maleic acid, quinolinic acid, and citric acid.

In this method of preparing a chemical mechanical polishing aqueous dispersion, the basic compound may be potassium hydroxide or ammonia.

In this method of preparing a chemical mechanical polishing aqueous dispersion, at least one of the first composition and the second composition may include benzotriazole.

In this method of preparing a chemical mechanical polishing aqueous dispersion, the first composition, the second composition, and a third composition which includes at least an oxidizing agent may be mixed to prepare the chemical mechanical polishing aqueous dispersion.

According to a third aspect of the invention, there is provided a chemical mechanical polishing aqueous dispersion produced by the above-described method.

According to a fourth aspect of the invention, there is provided a chemical mechanical polishing method comprising:

subjecting at least one polishing target surface selected from a copper or copper alloy layer, a barrier metal layer, and an insulating layer of a semiconductor device to chemical mechanical polishing by using the above-described chemical mechanical polishing aqueous dispersion.

According to the above chemical mechanical polishing aqueous dispersion preparation set, since the first composition and the second composition can be stored separately, aggregation of the colloidal silica contained in the first composition can be prevented. Specifically, a component that causes aggregation of the colloidal silica is eliminated from the first composition, and the pH of the first composition is adjusted to 8.0 to 11.0 by adding the basic compound. Therefore, the long-term stability of the colloidal silica can be ensured even if the first composition is concentrated. The pH of the second composition is adjusted to 1.0 to 5.0 by adding an organic acid having two or more carbonyl groups. Since the second composition has a function of a neutralizer, a chemical mechanical polishing aqueous dispersion having a pH of 3.5 to 6.0 can be prepared by mixing the second composition with the first composition. A chemical mechanical polishing aqueous dispersion thus obtained prevents aggregation of colloidal silica, reduces surface defects such as dishing, erosion, and scratches when planarizing the polishing target surface, and reduces fangs.

DETAILED DESCRIPTION OF THE EMBODIMENT

Figure 1A:
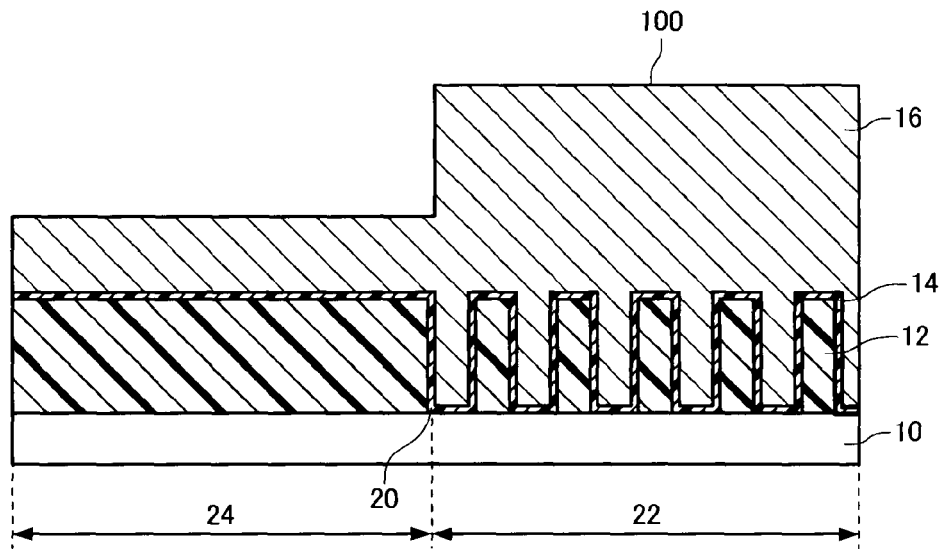
FIGS. 1A to 1D are cross-sectional views schematically showing a workpiece illustrative of a fang occurrence mechanism.
Figure 1B:
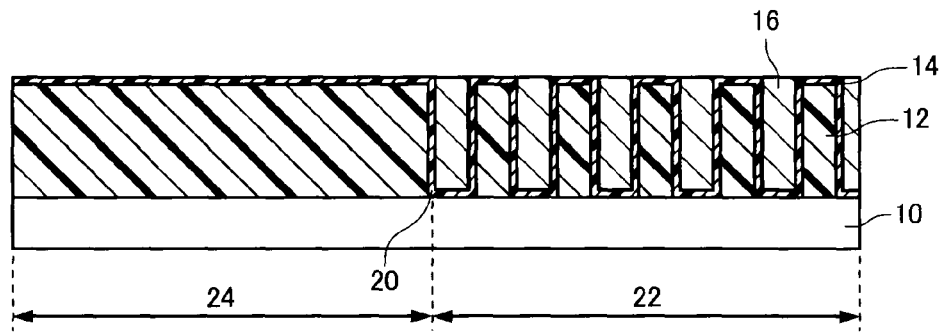
Figure 1C:
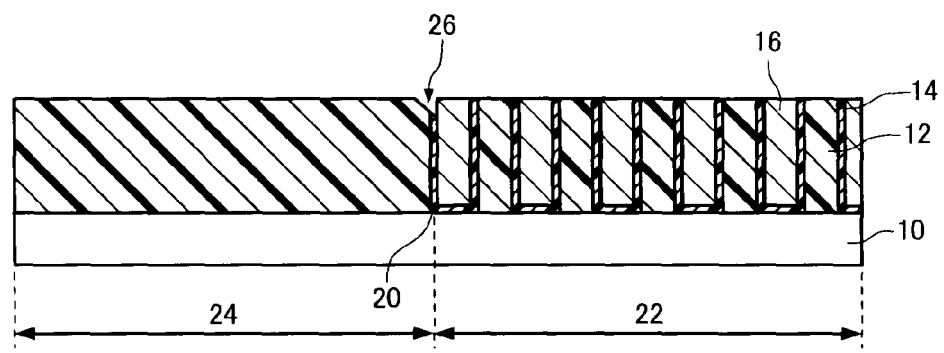
Figure 1D:
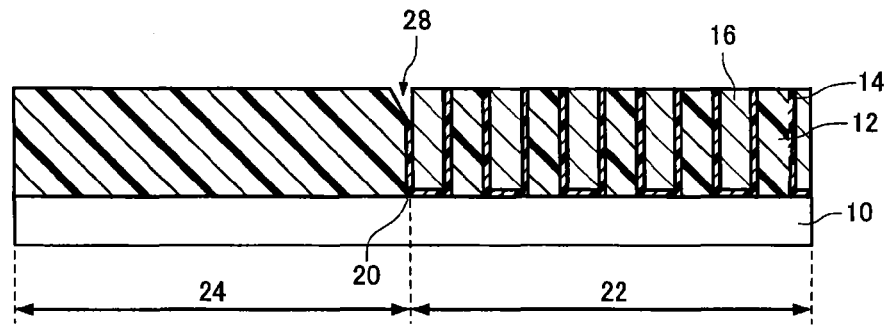

Embodiments of the invention are described in detail below.

1. FIRST COMPOSITION

A first composition according to one embodiment of the invention includes colloidal silica having an average primary particle diameter of 15 to 40 nm and a basic compound. The first composition is preferably weakly alkaline (8.0 to 11.0 pH) from the viewpoint of ensuring the dispersion stability of the colloidal silica. Each component is described in detail below.

1.1 Abrasive Grains

Abrasive grains used in the first composition may be at least one type of abrasive grains selected from inorganic particles, organic particles, and organic-inorganic composite particles.

Examples of the inorganic particles include silica, alumina, titania, zirconia, ceria, and the like. Examples of the silica include fumed silica, silica synthesized by a sol-gel method, colloidal silica, and the like. The fumed silica is obtained by reacting silicon chloride or the like with oxygen and water in a gaseous phase. The silica synthesized by the sol-gel method may be obtained by hydrolysis and/or condensation of an alkoxysilicon compound used as a raw material. The colloidal silica may be obtained by an inorganic colloid method using a raw material purified in advance, for example.

Examples of the organic particles include polyvinyl chloride, a styrene (co)polymer, a polyacetal, a polyester, a polyamide, a polycarbonate, an olefin (co)polymer, a phenoxy resin, an acrylic (co)polymer, and the like. Examples of the olefin (co)polymer include polyethylene, polypropylene, poly-1-butene, poly-4-methyl-1-pentene, and the like. Examples of the acrylic (co)polymer include polymethyl methacrylate and the like.

The type, the configuration, and the like of the organic-inorganic composite particles are not particularly limited insofar as inorganic particles and organic particles as mentioned above are integrally formed in such a manner that the inorganic particles and the organic particles are not easily separated during chemical mechanical polishing.

The organic-inorganic composite particles may have one of the following configurations (a) to (c), for example.

(a) Organic-inorganic composite particles obtained by polycondensation of an alkoxide compound of a metal or silicon in the presence of organic particles Examples of the alkoxide compound of a metal or silicon include an alkoxysilane, an aluminum alkoxide, a titanium alkoxide, and the like. The resulting polycondensate may be bonded to a functional group of the organic particle either directly or through an appropriate coupling agent (e.g., silane coupling agent).

(b) Organic-inorganic composite particles in which organic particles and inorganic particles having zeta potentials of opposite polarities (positive or negative) are bonded by an electrostatic force In this case, the composite particles may be formed by mixing the organic particles and the inorganic particles in a pH region in which the organic particles and the inorganic particles have zeta potentials of opposite polarities, or may be formed by mixing the organic particles and the inorganic particles in a pH region in which the organic particles and the inorganic particles have zeta potentials of an identical polarity and changing the liquid property to a pH region in which the organic particles and the inorganic particles have zeta potentials of opposite polarities.

(c) Organic-inorganic composite particles obtained by polycondensation of an alkoxide compound of a metal or silicon in the presence of the composite particles (b)

As the alkoxide compound of a metal or silicon, the alkoxide compound mentioned with regard to the organic-inorganic composite particles (a) may be used.

The abrasive grains used in the first composition are preferably at least one type of abrasive grains selected from silica, the organic particles, and the organic-inorganic composite particles mentioned above.

The average particle diameter of the abrasive grains is preferably 5 to 1000 nm, more preferably 7 to 700 nm, and particularly preferably 10 to 500 nm. An excellent polished surface can be obtained at an appropriate polishing rate using the abrasive grains having an average particle diameter within this range.

When using silica as the abrasive grains, the average primary particle diameter of the silica is preferably 10 to 100 nm, and particularly preferably 15 to 40 nm. A further excellent polished surface can be obtained at an appropriate polishing rate using inorganic particles having an average primary particle diameter within this range. Examples of the inorganic particles include fumed silica, colloidal silica, silica synthesized by a sol-gel method, and the like. It is particularly preferable to use colloidal silica. Since the dispersion stability of the first composition can be improved using colloidal silica, surface defects (e.g., scratches) on the polishing target surface can be reduced so that a polished surface with excellent flatness can be obtained.

The abrasive grains are added to the first composition in an amount of 2 to 30 mass %, and preferably 10 to 20 mass % based on the mass of the first composition.

1.2 Basic Compound

The basic compound used in the first composition prevents aggregation of the abrasive grains by maintaining the first composition in an alkaline state. If the pH of the first composition is set at 7.0 or less, the dispersion stability of the abrasive grains may deteriorate due to aggregation of the abrasive grains.

Examples of the basic compound used in the first composition include an organic base and an inorganic base. Examples of the organic base include tetramethylammonium hydroxide, triethylamine, and the like. Examples of the inorganic base include ammonia, potassium hydroxide, and the like. Of these basic compounds, it is preferable to use ammonia or potassium hydroxide (inorganic base).

1.3 Dispersion Medium

Examples of the dispersion medium include water, a mixed medium containing water and an alcohol, a mixed medium containing water and an organic solvent which is miscible with water, and the like. It is preferable to use water or a mixed medium containing water and an alcohol, with water being particularly preferable.

1.4 pH

The pH of the first composition is preferably 8.0 to 11.0, more preferably 9.0 to 11.0, and particularly preferably 9.0 to 10.0. If the pH of the first composition is lower than the above range, the abrasive grains aggregate and precipitate, thereby impairing the storage stability of the first composition. If the pH of the first composition is higher than the above range, the abrasive grains may be dissolved in the composition, whereby the properties of the composition may change during storage.

When the pH of the first composition is within the above range, an organic acid having two or more carbonyl groups (including poly(meth)acrylic acid) contained in a second composition may be added during preparation of the first composition. An organic acid having two or more carbonyl groups can be added during preparation of the first composition without causing a problem insofar as the pH of the first composition is within the above range. For example, the first composition according to this embodiment may be prepared by adding poly(meth)acrylic acid in an amount of 0.1 to 5 mass %, and preferably 0.5 to 2 mass % based on the mass of the first composition to improve the dispersion stability of colloidal silica, and adjusting the pH of the first composition within the above range by adding the basic compound.

2. SECOND COMPOSITION

The second composition according to this embodiment includes poly(meth)acrylic acid and an organic acid having two or more carbonyl groups other than poly(meth)acrylic acid. The second composition includes these acidic compounds, but preferably does not include the abrasive grains added to the first composition from the viewpoint of storage stability. Each component is described in detail below.

2.1 Acidic Compound

The second composition contains poly(meth)acrylic acid. A chemical mechanical polishing aqueous dispersion having an excellent process margin (i.e., the performance of an aqueous dispersion which prevents deterioration in the surface state of the polishing target surface even if chemical mechanical polishing is performed for a period of time greater than the optimum polishing time to a large extent) can be obtained by adding poly(meth)acrylic acid. Residual copper oxide can be removed while reducing copper dishing, erosion of an insulating layer, scratches, and fangs by adding the poly(meth)acrylic acid. The polyethylene glycol-reduced weight average molecular weight of the poly(meth)acrylic acid determined by gel permeation chromatography using water as an eluent is preferably 10,000 to 5,000,000, and more preferably 1,000,000 to 2,000,000. A chemical mechanical polishing aqueous dispersion having a further excellent process margin can be obtained using poly(meth)acrylic acid having a weight average molecular weight within this range.

The poly(meth)acrylic acid is preferably added to the second composition in an amount of 0.1 to 5 mass %, and more preferably 0.5 to 2 mass % based on the mass of the second composition. A chemical mechanical polishing aqueous dispersion having an excellent process margin can be obtained by adding the poly(meth)acrylic acid in an amount within this range.

For example, an excellent process margin can be reliably achieved when the poly(meth)acrylic acid has a weight average molecular weight of 1,000,000 to 3,000,000 and is added in an amount of 0.5 to 2 mass % based on the mass of the second composition.

An organic acid having two or more carbonyl groups other than the poly(meth)acrylic acid may be suitably added to the second composition. As the organic acid having two or more carbonyl groups, an organic acid having four or more carbon atoms is preferable. As the organic acid having four or more carbon atoms, an aliphatic organic acid having four or more carbon atoms and an organic acid having a heterocyclic ring are preferable.

As the aliphatic organic acid having four or more carbon atoms, an aliphatic polycarboxylic acid having four or more carbon atoms, a hydroxyl acid having four or more carbon atoms, and the like are preferable. Specific examples of the aliphatic polycarboxylic acid having four or more carbon atoms include a divalent organic acid such as maleic acid, succinic acid, fumaric acid, glutaric acid, and adipic acid. Specific examples of the hydroxyl acid having four or more carbon atoms include citric acid, malic acid, tartaric acid, and the like. Examples of the organic acid having a heterocyclic ring include quinolinecarboxylic acid, pyridinecarboxylic acid, pyridinedicarboxylic acid, pyrazinecarboxylic acid, and the like. Of these, quinaldic acid (e.g., 2-quinolinecarboxylic acid), quinolinic acid (e.g., 2,3-pyridinedicarboxylic acid), a divalent organic acid (e.g., maleic acid or citric acid), and a hydroxyl acid (e.g., malic acid or malonic acid) are preferable, with quinaldic acid and quinolinic acid being still more preferable.

It is preferable that the organic acid having two or more carbonyl groups other than poly(meth)acrylic acid have a pKa value of three or less. Examples of such an organic acid include maleic acid (pKa=1.75), fumaric acid, citric acid (pKa=2.87), glutamic acid, malonic acid, tartaric acid, and the like. The basic compound can be efficiently neutralized while reducing fangs to achieve excellent polishing properties by adding an organic acid having two or more carbonyl groups and having a pKa value of three or less.

The organic acid having two or more carbonyl groups other than poly(meth)acrylic acid is preferably at least one organic acid selected from maleic acid, quinolinic acid, and citric acid. Such an organic acid accelerates a complex-forming reaction with copper when subjecting a copper or copper alloy layer to chemical mechanical polishing, whereby the polishing rate can be increased.

The organic acid having two or more carbonyl groups is preferably added in an amount of 0.01 to 5 mass %, and more preferably 0.05 to 2 mass % based on the mass of the second composition. An excellent polished surface can be obtained at an appropriate polishing rate by adding the organic acid having two or more carbonyl groups in an amount within this range.

The mass ratio (PA/OA) of the mass (PA) of the poly(meth)acrylic acid to the mass (OA) of the organic acid having two or more carbonyl groups other than the poly(meth)acrylic acid included in the chemical mechanical polishing aqueous dispersion is preferably 0.2 to 5.0, more preferably 0.5 to 3.0, and particularly preferably 0.5 to 1.5. This reduces scratches, dishing, fangs, and the like so that an excellent polished surface can be obtained.

Examples of a counter cation contained in a poly(meth)acrylate include an ammonium ion, an alkylammonium ion, a potassium ion, and the like. An excellent process margin can be more reliably achieved when the poly(meth)acrylate is an ammonium salt of polyacrylic acid and added to the second composition in an amount of 0.5 to 2 mass %.

2.2 Dispersion Medium

Examples of a dispersion medium include water, a mixed medium containing water and an alcohol, a mixed medium containing water and an organic solvent which is miscible with water, and the like. It is preferable to use water or a mixed medium containing water and the alcohol, with water being particularly preferable.

2.3 pH

The pH of the second composition is preferably 1.0 to 5.0, more preferably 1.0 to 3.0, and particularly preferably 1.0 to 2.0. If the pH of the second composition is higher than 5.0, sufficient neutralization cannot be achieved when mixing the first composition and the second composition. Therefore, a chemical mechanical polishing aqueous dispersion obtained by mixing the first composition and the second composition has a pH in a basic region, whereby a pH region of 3.5 to 6.0 desired for polishing a polishing target surface cannot be achieved.

3. OTHER ADDITIVES

At least one of the first composition and the second composition may further include a water-soluble polymer, benzotriazole or a benzotriazole derivative, a surfactant, an oxidizing agent, and the like.

3.1 Water-Soluble Polymer

At least one of the first composition and the second composition may further include a water-soluble polymer.

Examples of the water-soluble polymer include an anionic polymer, a cationic polymer, an ampholytic polymer, a nonionic polymer, and the like.

Examples of the anionic polymer include polyvinyl alcohol and the like. Examples of the cationic polymer include polyethylenimine, polyvinylpyrrolidone, and the like. Examples of the ampholytic polymer include polyacrylamide and the like. Examples of the nonionic polymer include polyethylene oxide, polypropylene oxide, and the like.

The water-soluble polymer is added to the first composition in an amount of preferably 0.05 to 5 mass %, more preferably 0.1 to 3 mass %, and particularly preferably 0.5 to 2 mass % based on the mass of the first composition. The water-soluble polymer is added to the second composition in an amount of preferably 0.05 to 5 mass %, more preferably 0.1 to 3 mass %, and particularly preferably 0.5 to 2 mass % based on the mass of the second composition.

3.2 Benzotriazole or Benzotriazole Derivative

At least one of the first composition and the second composition may further include benzotriazole or a benzotriazole derivative.

The term "benzotriazole derivative" used herein refers to a compound obtained by replacing at least one hydrogen atom of benzotriazole by a functional group such as a carboxyl group, a methyl group, an amino group, or a hydroxyl group.

As the benzotriazole or the benzotriazole derivative, benzotriazole, methylbenzotriazole, 4-carboxybenzotriazole and its salt, 7-carboxybenzotriazole and its salt, benzotriazole butyl ester, 1-hydroxymethylbenzotriazole, 1-hydroxybenzotriazole, 1-(2,3-dihydroxypropyl)benzotriazole, 1-(2-hydroxyethyl)benzotriazole, 2-(benzotriazyl)ethanesulfonic acid and its salt, 1-(2-ethylhexylaminomethyl)benzotriazole, and the like are preferable. Of these, benzotriazole, methylbenzotriazole, 4-carboxybenzotriazole and its salt, 7-carboxybenzotriazole and its salt, benzotriazole butyl ester, 1-hydroxymethylbenzotriazole, and 1-hydroxybenzotriazole are more preferable, with benzotriazole being most preferable.

The benzotriazole or the benzotriazole derivative is added to the first composition in an amount of preferably 0.1 to 5 mass %, and more preferably 0.5 to 2 mass % based on the mass of the first composition. The benzotriazole or the benzotriazole derivative is added to the second composition in an amount of preferably 0.1 to 5 mass %, and more preferably 0.5 to 2 mass % based on the mass of the second composition. An excellent polished surface can be obtained at an appropriate polishing rate by adding the benzotriazole or the benzotriazole derivative in an amount within this range.

For example, an excellent polished surface can be obtained at an appropriate polishing rate in a well-balanced manner when the benzotriazole or the benzotriazole derivative is benzotriazole and is added to the first composition in an amount of 0.5 to 1.5 mass %.

3.3 Surfactant

At least one of the first composition and the second composition may further include a surfactant.

As the surfactant, a cationic surfactant, an anionic surfactant, an ampholytic surfactant, a nonionic surfactant, or the like may be used. It is preferable to use the anionic surfactant or the nonionic surfactant.

Examples of the anionic surfactant include a carboxylate, a sulfonate, a sulfate salt, a phosphate salt, a fluorine-containing surfactant, and the like. Examples of the carboxylate include a fatty acid soap, an alkyl ether carboxylate, and the like. Examples of the sulfonate include an alkylbenzenesulfonate, an alkylnaphthalenesulfonate, an alpha-olefin sulfonate, and the like. Examples of the sulfate salt include a higher alcohol sulfate salt, an alkyl ether sulfate, a polyoxyethylene alkyl phenyl ether sulfate, and the like. Examples of the phosphate salt include an alkyl phosphate salt and the like. Examples of the fluorine-containing surfactant include a perfluoroalkyl compound and the like. Among these anionic surfactants, the fluorine-containing surfactant is particularly preferable.

Examples of the nonionic surfactant include a polyethylene glycol type surfactant, acetylene glycol, an ethylene oxide addition product of acetylene glycol, an acetylene alcohol, and the like.

The surfactant is preferably added to the first composition in an amount of 0.05 to 2 mass %, and more preferably 0.1 to 1 mass % based on the mass of the first composition. The surfactant is added to the second composition in an amount of preferably 0.01 to 5 mass %, more preferably 0.05 to 2 mass %, and particularly preferably 0.1 to 1 mass % based on the mass of the second composition.

An appropriate surfactant may be selected depending on the type of the abrasive grains contained in the first composition. For example, when the abrasive grains are mainly silica, it is preferable to use the water-soluble polymer (e.g., anionic polymer, ampholytic polymer, or nonionic polymer) or the surfactant (e.g., anionic surfactant, amphoteric surfactant, or nonionic surfactant) as the dispersant, with the anionic polymer or the anionic surfactant being more preferable. These dispersants may be used either individually or in combination.

3.4 Oxidizing Agent

At least one of the first composition and the second composition may further include an oxidizing agent. For example, it is difficult to polish the surface of a copper film since copper is a metal having high malleability and ductility. The oxidizing agent oxidizes the surface of the copper film and accelerates a complex-forming reaction with the polishing liquid component to create a brittle modified layer on the surface of the copper film, thereby allowing the copper film to be easily polished.

Examples of the oxidizing agent include a persulfate, hydrogen peroxide, an inorganic acid, an organic peroxide, a polyvalent metal salt, and the like. Examples of the persulfate include ammonium persulfate, potassium persulfate, and the like. Examples of the inorganic acid include nitric acid, sulfuric acid, and the like. Examples of the organic peroxide include peracetic acid, perbenzoic acid, tert-butyl hydroperoxide, and the like.

Examples of the polyvalent metal salt include a permanganic acid compound, a dichromic acid compound, and the like. Examples of the permanganic acid compound include potassium permanganate and the like. Examples of the dichromic acid compound include potassium dichromate and the like.

Of these, hydrogen peroxide, the persulfate, and the inorganic acid are preferable, with hydrogen peroxide being particularly preferable.

The oxidizing agent is preferably added to the first composition in an amount of 0.1 to 10 mass %, and more preferably 0.5 to 5 mass % based on the mass of the first composition. The oxidizing agent is preferably added to the second composition in an amount of 0.1 to 10 mass %, and more preferably 0.5 to 5 mass % based on the mass of the first composition. An excellent polished surface can be obtained at an appropriate polishing rate by adding the oxidizing agent in an amount within this range.

The oxidizing agent may not be directly added to the first composition or the second composition according to this embodiment. A third composition containing the oxidizing agent may be separately provided, and the first composition, the second composition, and the third composition may be used as a chemical mechanical polishing aqueous dispersion preparation set. The function of the oxidizing agent may deteriorate due to the component added to the first composition or the second composition. In this case, deterioration in the function of the oxidizing agent can be prevented by separately providing the third composition containing the oxidizing agent.

When using hydrogen peroxide as the oxidizing agent, an appropriate polyvalent metal ion which promotes the function of hydrogen peroxide as the oxidizing agent or increases the polishing rate may be added to the chemical mechanical polishing aqueous dispersion. An excellent polished surface can be more reliably obtained at an appropriate polishing rate by adding hydrogen peroxide as the oxidizing agent in an amount of 0.01 to 5 mass %.

4. CHEMICAL MECHANICAL POLISHING METHOD

4.1 Chemical Mechanical Polishing Apparatus

Figure 2:
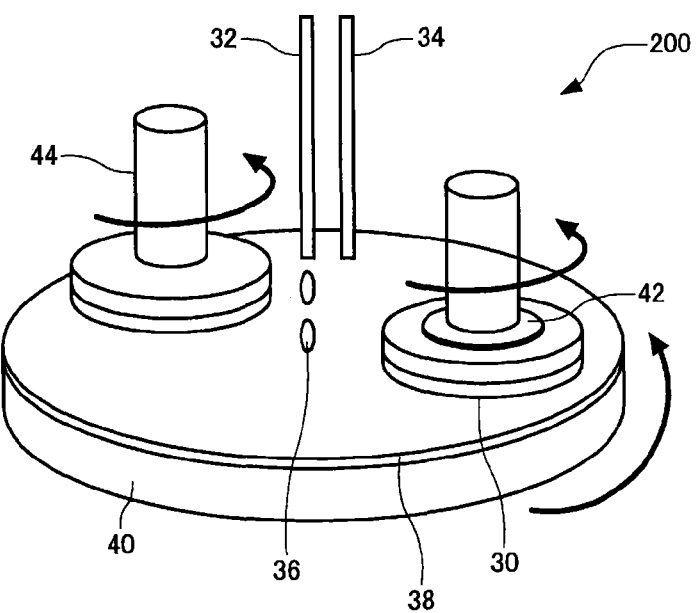
FIG. 2 is a schematic view showing a chemical mechanical polishing apparatus.

FIG. 2 is a schematic view showing a chemical mechanical polishing apparatus. As shown in FIG. 2, chemical mechanical polishing 200 is performed by bringing a top ring 42 that holds a semiconductor substrate 30 in contact with an abrasive cloth 38 while supplying a chemical mechanical polishing aqueous dispersion (slurry 36) from a slurry supply nozzle 32 and rotating a turntable 40 to which the abrasive cloth 38 is attached. FIG. 2 also shows a water supply nozzle 34 and a dresser 44.

The polishing load applied by the top ring 42 may be selected within the range of 10 to 1000 gf/cm$^2$ (0.98 to 98 kPa) (preferably 30 to 500 gf/cm$^2$ (2.94 to 49 kPa)). The rotational speed of the turntable 40 and the top ring 42 may be appropriately selected within the range of 10 to 400 rpm (preferably 30 to 150 rpm). The flow rate of the slurry 36 supplied from the slurry supply nozzle 32 may be selected within the range of 10 to 1,000 ml/min (preferably 50 to 400 ml/min).

The polishing target surface may be subjected to chemical mechanical polishing using a chemical mechanical polishing aqueous dispersion obtained utilizing the chemical mechanical polishing aqueous dispersion preparation set according to this embodiment under predetermined polishing conditions using a commercially-available chemical mechanical polishing apparatus (e.g., "EPO-112" or "EPO-222" manufactured by Ebara Corporation, "LGP-510" or "LGP-552" manufactured by Lapmaster SFT Corporation, or "Mirra" manufactured by Applied Materials, Inc.).

4.2 Method of Preparing Chemical Mechanical Polishing Aqueous Dispersion

A chemical mechanical polishing aqueous dispersion may be prepared using a chemical mechanical polishing aqueous dispersion preparation set according to one embodiment of the invention by mixing a first composition, a second composition, and an optional third composition containing an oxidizing agent of the chemical mechanical polishing aqueous dispersion preparation set. The compositions may be mixed by the methods as follows.

(1) The first composition, the second composition, and the optional third composition containing an oxidizing agent are mixed in advance to prepare a chemical mechanical polishing aqueous dispersion. The chemical mechanical polishing aqueous dispersion is supplied to the turntable 40 from the slurry supply nozzle 32 at the above-mentioned flow rate.

(2) The first composition or the second composition and the third composition containing an oxidizing agent are mixed in advance. The compositions are separately supplied to the turntable 40 from the slurry supply nozzle 32, and are mixed on the turntable 40.

(3) The first composition, the second composition, and the third composition containing an oxidizing agent are separately supplied to the turntable 40 from the slurry supply nozzle 32, and are mixed on the turntable 40.

The expression "mixed in advance" used herein refers to a method other than a method that separately supplies the compositions to the turntable 40 and mixes the compositions on the turntable 40 during a polishing operation. For example, the compositions may be mixed in advance in a tank or a supply line. The dispersion medium is mixed in advance with each composition.

When the polishing target surface includes a copper film, a barrier metal film, and an insulating film, the pH of the chemical mechanical polishing aqueous dispersion prepared by the above-described mixing methods (1) to (3) is preferably 3.5 to 6.0, and more preferably 3.5 to 5.0. Examples of the material for the barrier metal film include tantalum, titanium, tantalum nitride, titanium nitride, and the like. Examples of the material for the insulating film include silicon oxide ($SiO_2$) and the like. When the chemical mechanical polishing aqueous dispersion has a pH within the above range, the chemical mechanical polishing aqueous dispersion exhibits an excellent polishing performance for the copper film, the barrier metal film, and the insulating film.

The mass ratio (PA/OA) of the mass (PA) of the poly(meth) acrylic acid to the mass (OA) of the organic acid having two or more carbonyl groups other than the poly(meth)acrylic acid included in the chemical mechanical polishing aqueous dispersion is preferably 0.2 to 5.0, more preferably 0.5 to 3.0, and particularly preferably 0.5 to 1.5. This reduces scratches, dishing, fangs, and the like so that an excellent polished surface can be obtained.

4.3 Chemical Mechanical Polishing Method

The chemical mechanical polishing aqueous dispersion preparation set according to this embodiment may be applied to a wide range of chemical mechanical polishing tasks for producing semiconductor devices. In particular, the chemical mechanical polishing aqueous dispersion preparation set according to this embodiment may be suitably applied to a damascene interconnect formation process using copper as an interconnect material. In the damascene interconnect formation process using copper as an interconnect material, a barrier metal layer is formed on an insulating film (including grooves) in which grooves are formed corresponding to interconnects. After depositing copper (interconnect material) on the insulating film, a step of removing unnecessary copper (first polishing step), a step of removing the barrier metal outside the grooves (second polishing step), and a step of polishing the insulating film to some extent (third polishing step) are performed to obtain planar damascene interconnects. The chemical mechanical polishing aqueous dispersion preparation set according to this embodiment may be applied to the first to third polishing steps.

The term "copper" used herein refers to pure copper and an alloy of copper and aluminum, silicon, or the like having a copper content of 95 mass % or more.

The term "barrier metal" used herein refers to a barrier metal formed of tantalum, tantalum nitride, titanium, titanium nitride, tungsten nitride, or the like.

5. EXAMPLES

5.1 Preparation of Aqueous Dispersion

5.1.1 Preparation of Aqueous Dispersion Containing Colloidal Silica Particles (a) Preparation of Aqueous Dispersion Containing Colloidal Silica Particles C1

A flask was charged with 75 parts by mass of 25 mass % aqueous ammonia, 40 parts by mass of ion-exchanged water, 165 parts by mass of ethanol, and 30 parts by mass of tetraethoxysilane. The mixture was heated to 80° C. with stirring at a rotational speed of 180 rpm. After stirring the mixture at 80° C. for two hours, the mixture was cooled to room temperature. An alcohol dispersion of colloidal silica particles was thus obtained. An operation of removing the alcohol from the dispersion maintained at 80° C. using a rotary evaporator while adding ion-exchanged water was repeated several times. An aqueous dispersion containing 20 mass % of colloidal silica particles C1 was thus prepared.

The average primary particle diameter, the average secondary particle diameter, and the average degree of association of the colloidal silica particles C1 contained in the aqueous dispersion were respectively 35 nm, 70 nm, and 2.0.

(b) Method of Measuring Average Primary Particle Diameter and Average Particle Diameter of Colloidal Silica Particles The average primary particle diameter of the colloidal silica particles C1 prepared in "(a) Preparation of aqueous dispersion containing colloidal silica particles C1" was measured using a transmission electron microscope (TEM) ("H-7500" manufactured by Hitachi Ltd.). The average secondary particle diameter of the colloidal silica particles C1 was measured using a dynamic light scattering particle size analyzer ("LB550" manufactured by Horiba Ltd.).

(c) Preparation of Aqueous Dispersions Respectively Containing Colloidal Silica Particles C2 to C7

Aqueous dispersions respectively containing colloidal silica particles C2 to C4 shown in Table 1 were prepared in the same manner as in "(a) Preparation of aqueous dispersion containing colloidal silica particles C1", except for changing the amounts of 25 mass % aqueous ammonia, ethanol, and tetraethoxysilane.

Colloidal silica ("PL-2", "PL-3", or "PL-3H" manufactured by Fuso Chemical Co., Ltd.) was respectively dispersed in ion-exchanged water using an ultrasonic dispersion machine. The dispersions were filtered through a filter with a pore size of 5 micrometers to prepare aqueous dispersions respectively containing colloidal silica particles C5 to C7 shown in Table 1.

TABLE 1

| | Colloidal silica | | | | | | |
|---|---|---|---|---|---|---|---|
| | C1 | C2 | C3 | C4 | C5 | C6 | C7 |
| Content in aqueous dispersion (mass %) | 20 | 20 | 12 | 20 | 20 | 20 | 20 |
| Average primary particle diameter (nm) | 35 | 25 | 15 | 35 | 25 | 35 | 30 |
| Average particle diameter (nm) | 70 | 50 | 35 | 90 | 50 | 70 | 85 |
| Degree of association | 2.0 | 2.0 | 2.3 | 2.6 | 2.0 | 2.0 | 2.8 |

5.1.2 Preparation of Aqueous Dispersion Containing Organic-Inorganic Composite Particles (a) Preparation of Aqueous dispersion Containing Surface-Treated Organic Particles A flask was charged with 90 parts by mass of methyl methacrylate, 5 parts by mass of methoxy polyethylene glycol methacrylate ("NK Ester M-90G #400" manufactured by Shin-Nakamura Chemical Co., Ltd.), 5 parts by mass of 4-vinylpyridine, 2 parts by mass of an azo initiator ("V50" manufactured by Wako Pure Chemical Industries, Ltd.), and 400 parts by mass of ion-exchanged water. The mixture was heated to 70° C. with stirring in a nitrogen gas atmosphere. The mixture was stirred at 70° C. for six hours. The reaction mixture was diluted with ion-exchanged water to obtain an aqueous dispersion containing 10 mass % of polymethyl methacrylate particles having a functional group containing a cation of an amino group and a polyethylene glycol chain, and having an average particle diameter of 150 nm. The polymerization yield was 95%.

A flask was charged with 100 parts by mass of the aqueous dispersion. After the addition of 1 part by mass of methyltrimethoxysilane, the mixture was stirred at 40° C. for two hours. The pH of the mixture was adjusted to 2.0 by adding a 1N nitric acid aqueous solution to obtain an aqueous dispersion containing surface-treated organic particles. The zeta potential of the surface-treated organic particles contained in the aqueous dispersion was +17 mV.

(b) Preparation of Aqueous Dispersion Containing Inorganic Particles (Colloidal Silica Particles)

Colloidal silica particles ("Snowtex O" manufactured by Nissan Chemical Industries, Ltd., average primary particle diameter: 12 nm) were dispersed in water. The pH of the mixture was adjusted by adding a 1N potassium hydroxide aqueous solution to obtain an aqueous dispersion (pH: 8.0) containing 10 mass % of the colloidal silica particles. The zeta potential of the colloidal silica particles contained in the aqueous dispersion was −40 mV.

(c) Preparation of Aqueous Dispersion Containing Organic-Inorganic Composite Particles 50 parts by mass of the aqueous dispersion containing inorganic particles prepared in 5.1.2 (b) was slowly added to 100 parts by mass of the aqueous dispersion containing organic particles prepared in 5.1.2 (a) over two hours with stirring. The mixture was then stirred for two hours to obtain an aqueous dispersion in which the silica particles adhered to the polymethyl methacrylate particles.

After the addition of 2 parts by mass of vinyltriethoxysilane to the aqueous dispersion, the mixture was stirred for one hour, followed by the addition of 1 part by mass of tetraethoxysilane. After stirring the mixture at 60° C. for three hours, the mixture was cooled to room temperature to prepare an aqueous dispersion containing organic-inorganic composite particles having an average particle diameter of 180 nm.

The organic-inorganic composite particles contained in the aqueous dispersion were observed using a scanning electron microscope. It was found that the silica particles adhered to 80% of the surface of the polymethyl methacrylate particles.

5.1.3 Preparation of Aqueous Dispersion Containing Organic Particles

A flask was charged with 90 parts by mass of methyl methacrylate, 10 parts by mass of styrene, 5 parts by mass of acrylic acid, 2 parts by mass of ammonium persulfate, 0.1 parts by mass of a surfactant, and 400 parts by mass of ion-exchanged water. The mixture was heated to 70° C. with stirring in a nitrogen gas atmosphere, and polymerized for eight hours until the polymerization conversion rate reached approximately 100%. An aqueous dispersion containing organic particles (average particle diameter: 150 nm) formed of a polymethacrylate-styrene polymer having a carboxyl group was thus obtained. The aqueous dispersion was diluted with water to obtain an aqueous dispersion in which the content of the organic particles was adjusted to 10 mass %.

5.1.4 Preparation of Aqueous Solution Containing Polyacrylic Acid or its Salt (a) Preparation of Aqueous Solution Containing Polyacrylate P1

500 g of a 20 mass % acrylic acid aqueous solution was evenly added dropwise to a 2 liter container charged with 1000 g of ion-exchanged water and 10 g of a 5 mass % ammonium persulfate aqueous solution over 10 hours with stirring under reflux. After the addition, the mixture was allowed to stand for two hours under reflux to obtain an aqueous solution containing polyacrylic acid having a weight average molecular weight (Mw) of 10,000.

The aqueous solution was neutralized by slowly adding 25 mass % aqueous ammonia to prepare an aqueous solution (pH: 7.5) containing 5 mass % of polyacrylate (ammonium polyacrylate having a weight average molecular weight (Mw) of 10,000).

(b) Preparation of Aqueous Solutions Respectively Containing Polyacrylate P2, Polyacrylic Acid P3, and Polyacrylic Acid P4

Aqueous solutions (pH: 7.5) respectively containing 5 mass % of ammonium polyacrylate P2, 5 mass % of polyacrylic acid P3, and 5 mass % of polyacrylic acid P4 were prepared in the same manner as in (a), except for changing the amount of ammonium persulfate and the type of neutralizer as shown in Table 2.

TABLE 2

| Poly(meth)acrylate | P1 | P2 | P3 | P4 |
|---|---|---|---|---|
| Amount of ammonium persulfate (g) | 10 | 1 | 5 | 1 |
| Neutralizer | a | a | — | — |
| Weight average molecular weight (Mw) | 10,000 | 1,200,000 | 550,000 | 1,200,000 |
| Counter cation | $NH_4^+$ | $NH_4^+$ | — | — | a; 25 mass mass % aqueous ammonia 5.2 Chemical Mechanical Polishing Test 5.2.1 Evaluation of Polishing Rate A porous polyurethane polishing pad ("IC1000" manufactured by Nitta Haas Inc.) was installed in a chemical mechanical polishing apparatus ("Mirra" manufactured by Applied Materials, Inc.,). A polishing rate measurement substrate was polished for one minute under polishing conditions given below while supplying a chemical mechanical polishing aqueous dispersion described later. The polishing rate was calculated by a method given below.

(a) Polishing Rate Measurement Substrate

Eight-inch silicon substrate with thermal oxide film on which a copper film having a thickness of 15,000 angstroms was stacked Eight-inch silicon substrate with thermal oxide film on which a tantalum nitride film having a thickness of 2000 angstroms was stacked Eight-inch silicon substrate on which a PETEOS film having a thickness of 10,000 angstroms was stacked Eight-inch silicon substrate on which a BD film having a thickness of 10,000 was stacked by black diamond process developed by Applied Materials Japan Ltd.

(b) Polishing Conditions

Head rotational speed: 130 rpm
Platen rotational speed: 130 rpm
Head load: 1.5 psi
Supply rate of chemical mechanical polishing aqueous dispersion: 200 ml/min The term "supply rate of the chemical mechanical polishing aqueous dispersion" refers to the total amount of the chemical mechanical polishing aqueous dispersion supplied per unit time.

5.2.2 Calculation of Polishing Rate

The thickness of the copper film or the tantalum nitride film was measured after polishing using an electric conduction type thickness measurement device ("OmniMap RS75" manufactured by KLA-Tencor Corporation). The polishing rate was calculated from the reduction in thickness due to chemical mechanical polishing and the polishing time.

The thickness of the PETEOS film or the BD film was measured after polishing using an optical interference type thickness measurement device ("Nanospec 6100" manufactured by Nanometrics Japan Ltd.). The polishing rate was calculated from the reduction in thickness due to chemical mechanical polishing and the polishing time.

5.2.3 Evaluation of Scratches 200 unit areas (120×120 micrometers) were observed at random in a dark field using an optical microscope, and the number of unit areas in which scratches were observed was counted as the number of scratches.

5.2.4 Evaluation of Flatness (a) Fabrication of Polishing Target Substrate on which Copper Interconnects were Formed An insulating layer (composite film of PETEOS film (thickness: 500 angstroms) and BD film (thickness: 4500 angstroms)) having a groove pattern (depth: 1 micrometer) was stacked on the surface of a silicon substrate to a thickness of 5000 angstroms. A conductive barrier layer (TaN film) having a thickness of 250 angstroms was formed on the surface of the insulating layer. A metal layer (Cu layer) having a thickness of 1.1 micrometers was then deposited in the grooves covered with the TaN film by sputtering and plating.

(b) Evaluation of Dishing

The wafer fabricated in (a) was polished for 2.5 minutes using a Cu polishing aqueous dispersion at a polishing rate of 5000 angstroms per minute. The polished wafer was polished using a chemical mechanical polishing aqueous dispersion preparation set described later for a period of time calculated from the following equation.

Polishing time (minute)={(thickness of barrier layer (angstrom))/(polishing rate of barrier layer (tantalum nitride) calculated in "5.2.1. Evaluation of polishing rate")+(thickness of PETEOS film (500 angstroms))/(polishing rate of PETEOS film calculated in "5.2.1. Evaluation of polishing rate")+ (thickness of BD film (200 angstroms))/(polishing rate of BD film calculated in "5.2.1. Evaluation of polishing rate")

Dishing occurring in the interconnects (100 micrometers) on the polished surface was evaluated using a stylus profilometer ("HRP240" manufactured by KLA-Tencor Corporation). The term "dishing" used herein refers to the distance (difference in height) between the upper side (plane formed by the insulating layer or the conductive barrier layer) of the wafer and the lowest portion of the interconnect.

(c) Evaluation of Fangs

A fang occurring in the interconnects (100 micrometers) on the wafer fabricated in (a) was evaluated using a stylus profilometer ("HRP240" manufactured by KLA-Tencor Corporation). The term "fang" used herein refers to a hollow portion formed in the insulating layer or the conductive barrier layer at the interface between the insulating layer or the conductive barrier layer of the wafer and the interconnect. The smaller the depth of the fang, the higher the interconnect planarization performance.

5.3 Examples 1 to 8 and Comparative Examples 1 to 8

5.3.1 Example 1

(a) Preparation of First Composition

The aqueous dispersion C2 containing colloidal silica prepared in 5.1.1 in such an amount that the content of the inorganic particles in the resulting composition was 18.0 mass %, was mixed with the aqueous solution prepared in 5.1.4 in such an amount that the content of the ammonium polyacrylate P2 in the resulting composition was 0.2 mass %. After the addition of ion-exchanged water, the pH of the mixture was adjusted to 9.2 by adding potassium hydroxide. After the addition of ion-exchanged water so that the total amount of the components was 100 mass %, the mixture was filtered through a filter having a pore size of 1 micrometer to obtain an aqueous dispersion (A) containing 18 mass % of colloidal silica. The colloidal silica in the aqueous dispersion (A) was uniformly dispersed. The average particle diameter of the colloidal silica in the aqueous dispersion (A) was 139 nm.

(b) Preparation of Second Composition

Quinolinic acid in an amount corresponding to 0.1 mass % and benzotriazole in an amount corresponding to 0.8 mass % were dissolved in ion-exchanged water. After the addition of the ammonium polyacrylate P1 in an amount corresponding to 0.5 mass % and the ammonium polyacrylate P2 in an amount corresponding to 0.6 mass %, the mixture was stirred for 15 minutes. The pH of the mixture was adjusted to 3.5 by adding maleic acid. After the addition of ion-exchanged water so that the total amount of the components was 100 mass %, the mixture was filtered through a filter having a pore size of 0.5 micrometers to obtain an aqueous solution (B).

(c) Evaluation of Polishing Performance of Chemical Mechanical Polishing Aqueous Dispersion Prepared Using First Composition and Second Composition Immediately after Preparation The aqueous dispersion (A) and the aqueous solution (B) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion. The pH of the chemical mechanical polishing aqueous dispersion thus prepared was 3.6. A polishing rate measurement substrate was polished using the chemical mechanical polishing aqueous dispersion, and the polishing rate was calculated. The results are shown in Table 3.

(d) Evaluation of Polishing Performance of Chemical Mechanical Polishing Aqueous Dispersion Prepared Using First Composition and Second Composition which had been Allowed to Stand for Six Months after Preparation The aqueous dispersion (A) and the aqueous solution (B) prepared as described above were allowed to stand for six months in a thermostat bath at 25° C. in an airtight container. The colloidal silica C2 in the aqueous dispersion (A) which had been allowed to stand for six months was uniformly dispersed. The pH of the aqueous dispersion (A) was 9.2. The average particle diameter of the colloidal silica C2 was 140 nm. The aqueous solution (B) which had been allowed to stand for six months was a homogeneous solution. The pH of the aqueous solution (B) was 3.5.

The polishing performance for various films was evaluated in the same manner as in 5.3.1 (c) using the aqueous dispersion (A) and the aqueous solution (B) which had been allowed to stand for six months. The results are shown in Table 3. The pH of the chemical mechanical polishing aqueous dispersion prepared using the aqueous dispersion (A) and the aqueous solution (B) which had been allowed to stand for six months was 5.3. The average particle diameter of the particles contained in the chemical mechanical polishing aqueous dispersion was 163 nm. As is clear from the results shown in Table 3, the chemical mechanical polishing aqueous dispersion prepared using the aqueous dispersion (A) and the aqueous solution (B) which had been allowed to stand for six months after preparation had a polishing performance equal to that of the chemical mechanical polishing aqueous dispersion prepared using the aqueous dispersion (A) and the aqueous solution (B) immediately after preparation.

5.3.2 Comparative Example 1

The aqueous dispersion (A) and the aqueous solution (B) were mixed in equal amounts (mass) to prepare a chemical mechanical polishing aqueous dispersion (A+B). The chemical mechanical polishing aqueous dispersion (A+B) was allowed to stand for six months in a thermostat bath at 25° C. in an airtight container. Precipitates were observed in the chemical mechanical polishing aqueous dispersion (A+B) which had been allowed to stand for six months (i.e., the chemical mechanical polishing aqueous dispersion was separated into two layers). The average particle diameter of the particles contained in the chemical mechanical polishing aqueous dispersion (A+B) was 270 nm. The pH of the chemical mechanical polishing aqueous dispersion (A+B) which had been allowed to stand for six months was 5.2.

The polishing performance for various films was evaluated in the same manner as in 5.3.1 (c) using the chemical mechanical polishing aqueous dispersion (A+B) which had been allowed to stand for six months. The results are shown in Table 3. As is clear from the results shown in Table 3, the chemical mechanical polishing aqueous dispersion (A+B) which had been allowed to stand for six months had a decreased polishing performance as compared with the chemical mechanical polishing aqueous dispersion of Example 1.

measurement substrate was polished using the chemical mechanical polishing aqueous dispersion, and the polishing rate was calculated. The results are shown in Table 4.

TABLE 3

|  |  | Example 1 | | Comparative Example 1 |
| --- | --- | --- | --- | --- |
| First composition | Type | A | A | A + B |
|  | Storage period | Immediately after preparation | Six months after preparation | Storage period: six months after preparation |
| Second composition | Type | B | B |  |
|  | Storage period | Immediately after preparation | Six months after preparation |  |
| Polishing rate (angstrom/min) | Copper layer | 800 | 800 | 800 |
|  | Tantalum nitride layer | 750 | 750 | 650 |
|  | PETEOS layer | 750 | 750 | 550 |
|  | BD layer | 80 | 80 | 60 |
| Number of scratches (per area) |  | 0 | 0 | 10 |

5.3.3 Example 2

(a) Preparation of First Composition

Ion-exchanged water was added to the aqueous dispersion C2 containing colloidal silica prepared in 5.1.1 in such an amount that the content of the inorganic particles in the resulting composition was 18.5 mass %. The pH of the mixture was adjusted to 10.0 by adding potassium hydroxide. After the addition of ion-exchanged water so that the total amount of the components was 100 mass %, the mixture was filtered through a filter having a pore size of 1 micrometer to obtain an aqueous dispersion (C) containing 18.5 mass % of colloidal silica. The colloidal silica in the aqueous dispersion (C) was uniformly dispersed. The average particle diameter of the colloidal silica in the aqueous dispersion (C) was 45 nm.

(b) Preparation of Second Composition

Quinolinic acid in an amount corresponding to 0.2 mass % and benzotriazole in an amount corresponding to 0.8 mass % were dissolved in ion-exchanged water. After the addition of the ammonium polyacrylate P1 in an amount corresponding to 0.4 mass % and the polyacrylic acid P4 in an amount corresponding to 0.8 mass %, the mixture was stirred for 15 minutes. The pH of the mixture was adjusted to 1.7 by adding maleic acid. After the addition of ion-exchanged water so that the total amount of the components was 100 mass %, the mixture was filtered through a filter having a pore size of 0.5 micrometers to obtain an aqueous solution (D).

(c) Evaluation of Polishing Performance of Chemical Mechanical Polishing Aqueous Dispersion Prepared Using First Composition and Second Composition Immediately after Preparation The aqueous dispersion (C) and the aqueous solution (D) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.2 mass %, was added to the mixture to prepare a chemical mechanical polishing aqueous dispersion. The pH of the chemical mechanical polishing aqueous dispersion thus prepared was 3.7. A polishing rate

(d) Evaluation of Polishing Performance of Chemical Mechanical Polishing Aqueous Dispersion Prepared Using First Composition and Second Composition which had been Allowed to Stand for Six Months after Preparation The aqueous dispersion (C) and the aqueous solution (D) prepared as described above were allowed to stand for six months in a thermostat bath at 25° C. in an airtight container. The colloidal silica in the aqueous dispersion (C) which had been allowed to stand for six months was uniformly dispersed. The pH of the aqueous dispersion (C) was 9.9. The average particle diameter of the colloidal silica was 46 nm. The aqueous solution (D) which had been allowed to stand for six months was a homogeneous solution. The pH of the aqueous solution (D) was 1.7.

The polishing performance for various films was evaluated in the same manner as in 5.3.1 (c) using the aqueous dispersion (C) and the aqueous solution (D) which had been allowed to stand for six months. The pH of the chemical mechanical polishing aqueous dispersion prepared using the aqueous dispersion (C) and the aqueous solution (D) which had been allowed to stand for six months was 3.6. The average particle diameter of the colloidal silica was 80 nm. The results are shown in Table 4. As is clear from the results shown in Table 3, the chemical mechanical polishing aqueous dispersion prepared using the aqueous dispersion (C) and the aqueous solution (D) which had been allowed to stand for six months had a polishing performance equal to that of the chemical mechanical polishing aqueous dispersion prepared using the aqueous dispersion (C) and the aqueous solution (D) immediately after preparation.

5.3.4 Comparative Example 2

The aqueous dispersion (C) and the aqueous solution (D) were mixed in equal amounts (mass) to prepare a chemical mechanical polishing aqueous dispersion (C+D). The chemical mechanical polishing aqueous dispersion (C+D) was allowed to stand for six months in a thermostat bath at 25° C. in an airtight container. Precipitates were observed in the chemical mechanical polishing aqueous dispersion (C+D) which had been allowed to stand for six months (i.e., the chemical mechanical polishing aqueous dispersion was separated into two layers). The average particle diameter of the particles contained in the chemical mechanical polishing aqueous dispersion (C+D) was 180 nm.

The polishing performance for various films was evaluated in the same manner as in 5.3.1 (c) using the chemical mechanical polishing aqueous dispersion (C+D) which had been allowed to stand for six months. The results are shown in Table 4. As is clear from the results shown in Table 4, the chemical mechanical polishing aqueous dispersion (C+D) which had been allowed to stand for six months had a decreased polishing performance with respect to the surface properties of the polished surface. The pH of the chemical mechanical polishing aqueous dispersion (C+D) which had been allowed to stand for six months was 3.6.

(mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.2 mass %, was added to the mixture to prepare a chemical mechanical polishing aqueous dispersion. The pH of the chemical mechanical polishing aqueous dispersion thus prepared was 3.6. A polishing rate measurement substrate was polished using the chemical mechanical polishing aqueous dispersion, and the polishing rate was calculated. The results are shown in Table 5.

TABLE 4

| | | Example 2 | | Comparative Example 2 |
|---|---|---|---|---|
| First composition | Type | C | C | C + D |
| | Storage period | Immediately after preparation | Six months after preparation | Storage period: six months after preparation |
| Second composition | Type | D | D | |
| | Storage period | Immediately after preparation | Six months after preparation | |
| Polishing rate (angstrom/min) | Copper layer | 800 | 800 | 800 |
| | Tantalum nitride layer | 750 | 750 | 600 |
| | PETEOS layer | 700 | 700 | 500 |
| | BD layer | 80 | 80 | 60 |
| Number of scratches (per area) | | 0 | 0 | 10 |

5.3.5 Example 3

(a) Preparation of First Composition

The aqueous dispersion C1 containing colloidal silica prepared in 5.1.1 in such an amount that the content of the inorganic particles in the resulting composition was 0.8 mass %, was mixed with the aqueous dispersion C3 containing colloidal silica prepared in 5.1.1 in such an amount that the content of the inorganic particles in the resulting composition was 10.0 mass %. After the addition of ion-exchanged water, the pH of the mixture was adjusted to 10.3 by adding potassium hydroxide. After the addition of ion-exchanged water so that the total amount of the components was 100 mass %, the mixture was filtered through a filter having a pore size of 1 micrometer to obtain an aqueous dispersion (E) containing 10.8 mass % of colloidal silica. The colloidal silica in the aqueous dispersion (E) was uniformly dispersed. The average particle diameter of the colloidal silica in the aqueous dispersion (E) was 50 nm.

(b) Preparation of Second Composition

Benzotriazole in an amount corresponding to 1.6 mass % was dissolved in ion-exchanged water. After the addition of the polyacrylic acid P3 in an amount corresponding to 2.0 mass %, the mixture was stirred for 15 minutes. The pH of the mixture was adjusted to 1.6 by adding maleic acid. After the addition of ion-exchanged water so that the total amount of the components was 100 mass %, the mixture was filtered through a filter having a pore size of 0.5 micrometers to obtain an aqueous solution (F).

(c) Evaluation of Polishing Performance of Chemical Mechanical Polishing Aqueous Dispersion Prepared Using First Composition and Second Composition Immediately after Preparation The aqueous dispersion (E) and the aqueous solution (F) prepared as described above were mixed in equal amounts (d) Evaluation of Polishing Performance of Chemical Mechanical Polishing Aqueous Dispersion Prepared Using First Composition and Second Composition which had been Allowed to Stand for Six Months after Preparation The aqueous dispersion (E) and the aqueous solution (F) prepared as described above were allowed to stand for six months in a thermostat bath at 25° C. in an airtight container. The colloidal silica in the aqueous dispersion (E) which had been allowed to stand for six months was uniformly dispersed. The pH of the aqueous dispersion (E) was 9.9. The average particle diameter of the colloidal silica was 50 nm. The aqueous solution (F) which had been allowed to stand for six months was a homogeneous solution. The pH of the aqueous solution (F) was 1.6.

The polishing performance for various films was evaluated in the same manner as in 5.3.1 (c) using the aqueous dispersion (E) and the aqueous solution (F) which had been allowed to stand for six months. The pH of the chemical mechanical polishing aqueous dispersion prepared using the aqueous dispersion (E) and the aqueous solution (F) which had been allowed to stand for six months was 3.5. The average particle diameter of the colloidal silica was 80 nm. The results are shown in Table 5. As is clear from the results shown in Table 5, the chemical mechanical polishing aqueous dispersion prepared using the aqueous dispersion (E) and the aqueous solution (F) which had been allowed to stand for six months had a polishing performance equal to that of the chemical mechanical polishing aqueous dispersion prepared using the aqueous dispersion (E) and the aqueous solution (F) immediately after preparation.

5.3.6 Comparative Example 3

The aqueous dispersion (E) and the aqueous solution (F) were mixed in equal amounts (mass) to prepare a chemical mechanical polishing aqueous dispersion (E+F). The chemical mechanical polishing aqueous dispersion (E+F) was allowed to stand for six months in a thermostat bath at 25° C. in an airtight container. Precipitates were observed in the chemical mechanical polishing aqueous dispersion (E+F) which had been allowed to stand for six months (i.e., the chemical mechanical polishing aqueous dispersion was separated into two layers). The average particle diameter of the particles contained in the chemical mechanical polishing aqueous dispersion (E+F) was 100 nm.

The polishing performance for various films was evaluated in the same manner as in 5.3.1 (c) using the chemical mechanical polishing aqueous dispersion (E+F) which had been allowed to stand for six months. The results are shown in Table 5. As is clear from the results shown in Table 5, the chemical mechanical polishing aqueous dispersion (E+F) which had been allowed to stand for six months had a decreased polishing performance with respect to the surface properties of the polished surface. The pH of the chemical mechanical polishing aqueous dispersion (E+F) which had been allowed to stand for six months was 3.5.

the components was 100 mass %, the mixture was filtered through a filter having a pore size of 0.5 micrometers to obtain an aqueous solution (H).

(c) Evaluation of Polishing Performance of Chemical Mechanical Polishing Aqueous Dispersion Prepared Using First Composition and Second Composition Immediately after Preparation The aqueous dispersion (G) and the aqueous solution (H) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.2 mass %, was added to the mixture to prepare a chemical mechanical polishing aqueous dispersion. The pH of the chemical mechanical polishing aqueous dispersion thus prepared was 4.2. A polishing rate

TABLE 5

|  |  | Example 3 | | Comparative Example 3 |
| --- | --- | --- | --- | --- |
| First composition | Type | E | E | E + F |
|  | Storage period | Immediately after preparation | Six months after preparation | Storage period: six months after preparation |
| Second composition | Type | F | F |  |
|  | Storage period | Immediately after preparation | Six months after preparation |  |
| Polishing rate (angstrom/min) | Copper layer | 370 | 370 | 370 |
|  | Tantalum nitride layer | 760 | 760 | 650 |
|  | PETEOS layer | 430 | 430 | 300 |
|  | BD layer | 100 | 100 | 70 |
| Number of scratches (per area) |  | 0 | 1 | 10 |

5.3.7 Example 4

(a) Preparation of First Composition

The aqueous dispersion C4 containing colloidal silica prepared in 5.1.1 in such an amount that the content of the inorganic particles in the resulting composition was 18.5 mass %, was mixed with the aqueous solution prepared in 5.1.4 in such an amount that the content of the polyacrylic acid P4 in the resulting composition was 0.4 mass %. After the addition of ion-exchanged water, the pH of the mixture was adjusted to 10.0 by adding potassium hydroxide. After the addition of ion-exchanged water so that the total amount of the components was 100 mass %, the mixture was filtered through a filter having a pore size of 1 micrometer to obtain an aqueous dispersion (G) containing 18.5 mass % of colloidal silica. The colloidal silica in the aqueous dispersion (G) was uniformly dispersed. The average particle diameter of the colloidal silica in the aqueous dispersion (G) was 110 nm.

(b) Preparation of Second Composition

Citric acid in an amount corresponding to 0.1 mass % and benzotriazole in an amount corresponding to 0.8 mass % were dissolved in ion-exchanged water. After the addition of the polyacrylic acid P4 in an amount corresponding to 0.6 mass %, the mixture was stirred for 15 minutes. The pH of the mixture was adjusted to 1.5 by adding maleic acid. After the addition of ion-exchanged water so that the total amount of measurement substrate was polished using the chemical mechanical polishing aqueous dispersion, and the polishing rate was calculated. The results are shown in Table 6.

(d) Evaluation of Polishing Performance of Chemical Mechanical Polishing Aqueous Dispersion Prepared Using First Composition and Second Composition which had been Allowed to Stand for Six Months after Preparation The aqueous dispersion (G) and the aqueous solution (H) prepared as described above were allowed to stand for six months in a thermostat bath at 25° C. in an airtight container. The colloidal silica in the aqueous dispersion (G) which had been allowed to stand for six months was uniformly dispersed. The pH of the aqueous dispersion (G) was 9.9. The average particle diameter of the colloidal silica was 115 nm. The aqueous solution (H) which had been allowed to stand for six months was a homogeneous solution. The pH of the aqueous solution (H) was 1.5.

The polishing performance for various films was evaluated in the same manner as in 5.3.1 (c) using the aqueous dispersion (G) and the aqueous solution (H) which had been allowed to stand for six months. The pH of the chemical mechanical polishing aqueous dispersion prepared using the aqueous dispersion (G) and the aqueous solution (H) which had been allowed to stand for six months was 4.1. The average particle diameter of the colloidal silica was 100 nm. The results are shown in Table 6. As is clear from the results shown in Table 5, the chemical mechanical polishing aqueous dispersion prepared using the aqueous dispersion (G) and the aqueous solution (H) which had been allowed to stand for six months had a polishing performance equal to that of the chemical mechanical polishing aqueous dispersion prepared using the aqueous dispersion (G) and the aqueous solution (H) immediately after preparation.

5.3.8 Comparative Example 4

The aqueous dispersion (G) and the aqueous solution (H) were mixed in equal amounts (mass) to prepare a chemical mechanical polishing aqueous dispersion (G+H). The chemical mechanical polishing aqueous dispersion (G+H) was allowed to stand for six months in a thermostat bath at 25° C. in an airtight container. Precipitates were observed in the chemical mechanical polishing aqueous dispersion (G+H) which had been allowed to stand for six months (i.e., the chemical mechanical polishing aqueous dispersion was separated into two layers). The average particle diameter of the particles contained in the chemical mechanical polishing aqueous dispersion (G+H) was 300 nm.

The polishing performance for various films was evaluated in the same manner as in 5.3.1 (c) using the chemical mechanical polishing aqueous dispersion (G+H) which had been allowed to stand for six months. The results are shown in Table 6. As is clear from the results shown in Table 6, the chemical mechanical polishing aqueous dispersion (G+H) which had been allowed to stand for six months had a decreased polishing performance with respect to the surface properties of the polished surface. The pH of the chemical mechanical polishing aqueous dispersion (G+H) which had been allowed to stand for six months was 4.1.

persed. The average particle diameter of the particles contained in the aqueous dispersion (I) was 180 nm.

(b) Preparation of Second Composition

Benzotriazole in an amount corresponding to 0.8 mass % was dissolved in ion-exchanged water. After the addition of the ammonium polyacrylate P1 in an amount corresponding to 0.4 mass %, the mixture was stirred for 15 minutes. The pH of the mixture was adjusted to 2.1 by adding maleic acid. After the addition of ion-exchanged water so that the total amount of the components was 100 mass %, the mixture was filtered through a filter having a pore size of 0.5 micrometers to obtain an aqueous solution (J).

(c) Evaluation of Polishing Performance of Chemical Mechanical Polishing Aqueous Dispersion Prepared Using First Composition and Second Composition Immediately after Preparation The aqueous dispersion (I) and the aqueous solution (J) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.2 mass %, was added to the mixture to prepare a chemical mechanical polishing aqueous dispersion. The pH of the chemical mechanical polishing aqueous dispersion thus prepared was 5.8. A polishing rate measurement substrate was polished using the chemical

TABLE 6

|  |  | Example 4 |  | Comparative Example 4 |
|---|---|---|---|---|
| First composition | Type | G | G | G + H |
|  | Storage period | Immediately after preparation | Six months after preparation | Storage period: six months after preparation |
| Second composition | Type | H | H |  |
|  | Storage period | Immediately after preparation | Six months after preparation |  |
| Polishing rate (angstrom/min) | Copper layer | 900 | 900 | 950 |
|  | Tantalum nitride layer | 650 | 650 | 500 |
|  | PETEOS layer | 800 | 800 | 650 |
|  | BD layer | 50 | 50 | 40 |
| Number of scratches (per area) |  | 0 | 0 | 10 |

5.3.9 Example 5

(a) Preparation of First Composition

The aqueous dispersion C3 containing colloidal silica prepared in 5.1.1 in such an amount that the content of the inorganic particles in the resulting composition was 10.0 mass %, was mixed with the aqueous dispersion containing organic-inorganic composite particles prepared in 5.1.2 in such an amount that the content of the organic-inorganic composite particles in the resulting composition was 0.5 mass %. After the addition of ion-exchanged water, the pH of the mixture was adjusted to 10.4 by adding potassium hydroxide. After the addition of ion-exchanged water so that the total amount of the components was 100 mass %, the mixture was filtered through a filter having a pore size of 1 micrometer to obtain an aqueous dispersion (I) containing the colloidal silica and the organic-inorganic composite particles. The colloidal silica in the aqueous dispersion (I) was uniformly dismechanical polishing aqueous dispersion, and the polishing rate was calculated. The results are shown in Table 7.

(d) Evaluation of Polishing Performance of Chemical Mechanical Polishing Aqueous Dispersion Prepared Using First Composition and Second Composition which had been Allowed to Stand for Six Months after Preparation The aqueous dispersion (I) and the aqueous solution (J) prepared as described above were allowed to stand for six months in a thermostat bath at 25° C. in an airtight container. The colloidal silica and the organic-inorganic composite particles in the aqueous dispersion (I) which had been allowed to stand for six months were uniformly dispersed. The pH of the aqueous dispersion (I) was 10.2. The average particle diameter of the particles contained in the aqueous dispersion (I) was 180 nm. The aqueous solution (J) which had been allowed to stand for six months was a homogeneous solution. The pH of the aqueous solution (J) was 2.1.

The polishing performance for various films was evaluated in the same manner as in 5.3.1 (c) using the aqueous dispersion (I) and the aqueous solution (J) which had been allowed to stand for six months. The pH of the chemical mechanical polishing aqueous dispersion prepared using the aqueous dispersion (I) and the aqueous solution (J) which had been allowed to stand for six months was 5.7. The average particle diameter of the particles contained in the chemical mechanical polishing aqueous dispersion was 155 nm. The results are shown in Table 7. As is clear from the results shown in Table 5, the chemical mechanical polishing aqueous dispersion prepared using the aqueous dispersion (I) and the aqueous solution (J) which had been allowed to stand for six months had a polishing performance equal to that of the chemical mechanical polishing aqueous dispersion prepared using the aqueous dispersion (I) and the aqueous solution (J) immediately after preparation.

5.3.10 Comparative Example 5

The aqueous dispersion (I) and the aqueous solution (J) were mixed in equal amounts (mass) to prepare a chemical mechanical polishing aqueous dispersion (I+J). The chemical mechanical polishing aqueous dispersion (I+J) was allowed to stand for six months in a thermostat bath at 25° C. in an airtight container. Precipitates were observed in the chemical mechanical polishing aqueous dispersion (I+J) which had been allowed to stand for six months (i.e., the chemical mechanical polishing aqueous dispersion was separated into two layers). The average particle diameter of the particles contained in the chemical mechanical polishing aqueous dispersion (I+J) was 250 nm.

The polishing performance for various films was evaluated in the same manner as in 5.3.1 (c) using the chemical mechanical polishing aqueous dispersion (I+J) which had been allowed to stand for six months. The results are shown in Table 7. As is clear from the results shown in Table 7, the chemical mechanical polishing aqueous dispersion (I+J) which had been allowed to stand for six months had a decreased polishing performance with respect to the surface properties of the polished surface. The pH of the chemical mechanical polishing aqueous dispersion (I+J) which had been allowed to stand for six months was 5.7.

inorganic particles in the resulting composition was 18.5 mass %, was mixed with the aqueous dispersion containing organic particles prepared in 5.1.3 in such an amount that the content of the organic particles in the resulting composition was 0.5 mass %. After the addition of ion-exchanged water, the pH of the mixture was adjusted to 10.0 by adding potassium hydroxide. After the addition of ion-exchanged water so that the total amount of the components was 100 mass %, the mixture was filtered through a filter having a pore size of 1 micrometer to obtain an aqueous dispersion (K) containing the colloidal silica and the organic particles. The colloidal silica and the organic particles in the aqueous dispersion (K) were uniformly dispersed. The average particle diameter of the particles contained in the aqueous dispersion (K) was 150 nm.

(b) Preparation of Second Composition

Quinolinic acid in an amount corresponding to 0.15 mass % and benzotriazole in an amount corresponding to 0.8 mass % were dissolved in ion-exchanged water. After the addition of the polyacrylic acid P4 in an amount corresponding to 1.6 mass %, the mixture was stirred for 15 minutes. The pH of the mixture was adjusted to 1.5 by adding maleic acid. After the addition of ion-exchanged water so that the total amount of the components was 100 mass %, the mixture was filtered through a filter having a pore size of 0.5 micrometers to obtain an aqueous solution (L).

(c) Evaluation of Polishing Performance of Chemical Mechanical Polishing Aqueous Dispersion Prepared Using First Composition and Second Composition Immediately after Preparation The aqueous dispersion (K) and the aqueous solution (L) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to

TABLE 7

|  |  | Example 5 | | Comparative Example 5 |
| --- | --- | --- | --- | --- |
| First composition | Type | I | I | I + J |
|  | Storage period | Immediately after preparation | Six months after preparation | Storage period: six months after preparation |
| Second composition | Type | J | J |  |
|  | Storage period | Immediately after preparation | Six months after preparation |  |
| Polishing rate (angstrom/min) | Copper layer | 350 | 350 | 350 |
|  | Tantalum nitride layer | 800 | 800 | 710 |
|  | PETEOS layer | 270 | 270 | 150 |
|  | BD layer | 40 | 40 | 25 |
| Number of scratches (per area) |  | 0 | 2 | 10 |

5.3.11 Example 6

(a) Preparation of First Composition

The aqueous dispersion C2 containing colloidal silica prepared in 5.1.1 in such an amount that the content of the the mixture to prepare a chemical mechanical polishing aqueous dispersion. The pH of the chemical mechanical polishing aqueous dispersion thus prepared was 3.8. A polishing rate measurement substrate was polished using the chemical mechanical polishing aqueous dispersion, and the polishing rate was calculated. The results are shown in Table 8.

(d) Evaluation of Polishing Performance of
Chemical Mechanical Polishing Aqueous Dispersion
Prepared Using First Composition and Second
Composition which had been Allowed to Stand for
Six Months after Preparation The aqueous dispersion (K) and the aqueous solution (L) prepared as described above were allowed to stand for six months in a thermostat bath at 25° C. in an airtight container. The colloidal silica and the organic particles in the aqueous dispersion (K) which had been allowed to stand for six months were uniformly dispersed. The pH of the aqueous dispersion (K) was 9.9. The average particle diameter of the particles contained in the aqueous dispersion (K) was 150 nm. The aqueous solution (L) which had been allowed to stand for six months was a homogeneous solution. The pH of the aqueous solution (L) was 1.5.

The polishing performance for various films was evaluated in the same manner as in 5.3.1 (c) using the aqueous dispersion (K) and the aqueous solution (L) which had been allowed to stand for six months. The pH of the chemical mechanical polishing aqueous dispersion prepared using the aqueous dispersion (K) and the aqueous solution (L) which had been allowed to stand for six months was 3.6. The average particle diameter of the particles contained in the chemical mechanical polishing aqueous dispersion was 200 nm. The results are shown in Table 8. As is clear from the results shown in Table 8, the chemical mechanical polishing aqueous dispersion prepared using the aqueous dispersion (K) and the aqueous solution (L) which had been allowed to stand for six months had a polishing performance equal to that of the chemical mechanical polishing aqueous dispersion prepared using the aqueous dispersion (K) and the aqueous solution (L) immediately after preparation.

5.3.12 Comparative Example 6

The aqueous dispersion (K) and the aqueous solution (L) were mixed in equal amounts (mass) to prepare a chemical mechanical polishing aqueous dispersion (K+L). The chemical mechanical polishing aqueous dispersion (K+L) was allowed to stand for six months in a thermostat bath at 25° C. in an airtight container. Precipitates were observed in the chemical mechanical polishing aqueous dispersion (K+L) which had been allowed to stand for six months (i.e., the chemical mechanical polishing aqueous dispersion was separated into two layers). The average particle diameter of the particles contained in the chemical mechanical polishing aqueous dispersion (K+L) was 320 nm.

The polishing performance for various films was evaluated in the same manner as in 5.3.1 (c) using the chemical mechanical polishing aqueous dispersion (K+L) which had been allowed to stand for six months. The results are shown in Table 8. As is clear from the results shown in Table 8, the chemical mechanical polishing aqueous dispersion (K+L) which had been allowed to stand for six months had a decreased polishing performance with respect to the surface properties of the polished surface. The pH of the chemical mechanical polishing aqueous dispersion (K+L) which had been allowed to stand for six months was 3.5.

TABLE 8

|  |  | Example 6 | | Comparative Example 6 |
| --- | --- | --- | --- | --- |
| First composition | Type | K | K | K + L |
|  | Storage period | Immediately after preparation | Six months after preparation | Storage period: six months after preparation |
| Second composition | Type | L | L |  |
|  | Storage period | Immediately after preparation | Six months after preparation |  |
| Polishing rate (angstrom/min) | Copper layer | 770 | 770 | 750 |
|  | Tantalum nitride layer | 650 | 650 | 500 |
|  | PETEOS layer | 500 | 500 | 350 |
|  | BD layer | 50 | 50 | 30 |
| Number of scratches (per area) |  | 0 | 0 | 10 |

5.3.13 Example 7

(a) Preparation of First Composition

An aqueous dispersion (W) containing 18.5 mass % of the colloidal silica C5 was obtained in the same manner as in Example 1, except for changing the components as shown in Table 13.

(b) Preparation of Second Composition

An aqueous solution (X) was obtained in the same manner as in Example 1, except for changing the components as shown in Table 13.

(c) Evaluation of Polishing Performance of Chemical
Mechanical Polishing Aqueous Dispersion Prepared
Using First Composition and Second Composition
Immediately after Preparation The aqueous dispersion (W) and the aqueous solution (X) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion. The pH of the chemical mechanical polishing aqueous dispersion thus prepared was 5.3. A polishing rate measurement substrate was polished using the chemical mechanical polishing aqueous dispersion, and the polishing rate was calculated. The results are shown in Table 9.

(d) Evaluation of Polishing Performance of
Chemical Mechanical Polishing Aqueous Dispersion
Prepared Using First Composition and Second
Composition which had been Allowed to Stand for
Six Months after Preparation The aqueous dispersion (W) and the aqueous solution (X) prepared as described above were allowed to stand for six months in a thermostat bath at 25° C. in an airtight container. The colloidal silica in the aqueous dispersion (W) which had been allowed to stand for six months was uniformly dispersed. The pH of the aqueous dispersion (W) was 10.2. The average particle diameter of the particles contained in the aqueous dispersion (W) was 45 nm. The aqueous solution (X) which had been allowed to stand for six months was a homogeneous solution. The pH of the aqueous solution (X) was 1.7.

The polishing performance for various films was evaluated in the same manner as in 5.3.1 (c) using the aqueous dispersion (W) and the aqueous solution (X) which had been allowed to stand for six months. The pH of the chemical mechanical polishing aqueous dispersion prepared using the aqueous dispersion (W) and the aqueous solution (X) which had been allowed to stand for six months was 5.3. The average particle diameter of the particles contained in the chemical mechanical polishing aqueous dispersion was 70 nm. The results are shown in Table 9. As is clear from the results shown in Table 9, the chemical mechanical polishing aqueous dispersion prepared using the aqueous dispersion (W) and the aqueous solution (X) which had been allowed to stand for six months had a polishing performance equal to that of the chemical mechanical polishing aqueous dispersion prepared using the aqueous dispersion (W) and the aqueous solution (W) immediately after preparation.

5.3.14 Comparative Example 7

The aqueous dispersion (W) and the aqueous solution (X) were mixed in equal amounts (mass) to prepare a chemical mechanical polishing aqueous dispersion (W+X). The chemical mechanical polishing aqueous dispersion (W+X) was allowed to stand for six months in a thermostat bath at 25° C. in an airtight container. Precipitates were observed in the chemical mechanical polishing aqueous dispersion (W+X) which had been allowed to stand for six months (i.e., the chemical mechanical polishing aqueous dispersion was separated into two layers). The average particle diameter of the particles contained in the chemical mechanical polishing aqueous dispersion (W+X) was 460 nm.

The polishing performance for various films was evaluated in the same manner as in 5.3.1 (c) using the chemical mechanical polishing aqueous dispersion (W+X) which had been allowed to stand for six months. The results are shown in Table 9. As is clear from the results shown in Table 9, the chemical mechanical polishing aqueous dispersion (W+X) which had been allowed to stand for six months had a decreased polishing performance with respect to the surface properties of the polished surface. The pH of the chemical mechanical polishing aqueous dispersion (W+X) which had been allowed to stand for six months was 5.2.

TABLE 9

|  |  | Example 7 | | Comparative Example 7 |
|---|---|---|---|---|
| First composition | Type | W | W | W + X |
|  | Storage period | Immediately after preparation | Six months after preparation | Storage period: six months after preparation |
| Second composition | Type | X | X |  |
|  | Storage period | Immediately after preparation | Six months after preparation |  |
| Polishing rate (angstrom/min) | Copper layer | 530 | 530 | 530 |
|  | Tantalum nitride layer | 600 | 600 | 450 |
|  | PETEOS layer | 850 | 850 | 690 |
|  | BD layer | 50 | 50 | 50 |
| Number of scratches (per area) |  | 0 | 0 | 2 |

5.3.15 Example 8

(a) Preparation of First Composition

An aqueous dispersion (Y) containing 18.5 mass % of the colloidal silica C6 was obtained in the same manner as in Example 1, except for changing the components as shown in Table 13.

(b) Preparation of Second Composition

An aqueous solution (Z) was obtained in the same manner as in Example 1, except for changing the components as shown in Table 13.

(c) Evaluation of Polishing Performance of Chemical Mechanical Polishing Aqueous Dispersion Prepared Using First Composition and Second Composition Immediately after Preparation The aqueous dispersion (Y) and the aqueous solution (Z) prepared as described above were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion. The pH of the chemical mechanical polishing aqueous dispersion thus prepared was 3.9. A polishing rate measurement substrate was polished using the chemical mechanical polishing aqueous dispersion, and the polishing rate was calculated. The results are shown in Table 10.

(d) Evaluation of Polishing Performance of Chemical Mechanical Polishing Aqueous Dispersion Prepared Using First Composition and Second Composition which had been Allowed to Stand for Six Months after Preparation The aqueous dispersion (Y) and the aqueous solution (Z) prepared as described above were allowed to stand for six months in a thermostat bath at 25° C. in an airtight container. The colloidal silica in the aqueous dispersion (Y) which had been allowed to stand for six months was uniformly dispersed. The pH of the aqueous dispersion (Y) was 10.5. The average particle diameter of the particles contained in the aqueous dispersion (Y) was 68 nm. The aqueous solution (Z) which had been allowed to stand for six months was a homogeneous solution. The pH of the aqueous solution (Z) was 1.6.

The polishing performance for various films was evaluated in the same manner as in 5.3.1 (c) using the aqueous dispersion (Y) and the aqueous solution (Z) which had been allowed to stand for six months. The pH of the chemical mechanical polishing aqueous dispersion prepared using the aqueous dispersion (Y) and the aqueous solution (Z) which had been allowed to stand for six months was 3.9. The average particle diameter of the particles contained in the chemical mechanical polishing aqueous dispersion was 100 nm. The results are shown in Table 10. As is clear from the results shown in Table 10, the chemical mechanical polishing aqueous dispersion prepared using the aqueous dispersion (Y) and the aqueous solution (Z) which had been allowed to stand for six months had a polishing performance equal to that of the chemical mechanical polishing aqueous dispersion prepared using the aqueous dispersion (Y) and the aqueous solution (Z) immediately after preparation.

5.3.16 Comparative Example 8

The aqueous dispersion (Y) and the aqueous solution (Z) were mixed in equal amounts (mass) to prepare a chemical mechanical polishing aqueous dispersion (Y+Z). The chemical mechanical polishing aqueous dispersion (Y+Z) was allowed to stand for six months in a thermostat bath at 25° C. in an airtight container. Precipitates were observed in the chemical mechanical polishing aqueous dispersion (Y+Z) which had been allowed to stand for six months (i.e., the chemical mechanical polishing aqueous dispersion was separated into two layers). The average particle diameter of the particles contained in the aqueous dispersion (Y+Z) could not be measured since precipitation occurred to a large extent.

The polishing performance for various films was evaluated in the same manner as in 5.3.1 (c) using the chemical mechanical polishing aqueous dispersion (Y+Z) which had been allowed to stand for six months. The results are shown in Table 9. As is clear from the results shown in Table 9, the chemical mechanical polishing aqueous dispersion (Y+Z) which had been allowed to stand for six months had a decreased polishing performance with respect to the surface properties of the polished surface. The pH of the chemical mechanical polishing aqueous dispersion (Y+Z) which had been allowed to stand for six months was 3.8.

TABLE 10

|  |  | Example 8 | Example 8 | Comparative Example 8 |
|---|---|---|---|---|
| First composition | Type | Y | Y | Y + Z |
|  | Storage period | Immediately after preparation | Six months after preparation | Storage period: six months after preparation |
| Second composition | Type | Z | Z |  |
|  | Storage period | Immediately after preparation | Six months after preparation |  |
| Polishing rate (angstrom/min) | Copper layer | 880 | 880 | 880 |
|  | Tantalum nitride layer | 640 | 640 | 500 |
|  | PETEOS layer | 870 | 870 | 710 |
|  | BD layer | 95 | 95 | 90 |
| Number of scratches (per area) |  | 0 | 0 | 1 |

The compositions of the first compositions (A to L) and the second compositions (W to Z) used in Examples 1 to 8 and Comparative Examples 1 to 8 are summarized in Tables 11 to 13.

TABLE 11

| Composition | A | | B | | C | | D | | E | | F | |
|---|---|---|---|---|---|---|---|---|---|---|---|---|
|  | Type | Mass % | Type | Mass % | Type | Mass % | Type | Mass % | Type | Mass % | Type | Mass % |
| Colloidal silica | C2 | 18.0 |  |  | C2 | 18.5 |  |  | C1 | 0.8 |  |  |
|  |  |  |  |  |  |  |  |  | C3 | 10.0 |  |  |
| Organic-inorganic composite particles |  |  |  |  |  |  |  |  |  |  |  |  |
| Organic particles |  |  |  |  |  |  |  |  |  |  |  |  |
| Acidic compound | P2 | 0.2 | P1 | 0.5 |  |  | P1 | 0.4 |  |  | P3 | 2.0 |
|  |  |  | P2 | 0.6 |  |  | P4 | 0.8 |  |  | Maleic acid | 0.6 |
|  |  |  | Quinolinic acid | 0.1 |  |  | Quinolinic acid | 0.2 |  |  |  |  |
|  |  |  | Maleic acid | 1.1 |  |  | Maleic acid | 1.5 |  |  |  |  |
| Basic compound | KOH | 0.35 |  |  | KOH | 0.6 |  |  | KOH | 0.5 |  |  |
| Benzotriazole |  |  |  | 0.8 |  |  |  | 0.8 |  |  |  | 1.6 |
| pH |  | 9.2 |  | 3.5 |  | 10.0 |  | 1.7 |  | 10.3 |  | 1.6 |
| PA |  |  |  | 1.30 |  |  |  | 1.20 |  |  |  | 2.00 |
| PO |  |  |  | 1.20 |  |  |  | 1.70 |  |  |  | 0.60 |
| PA/PO |  |  |  | 1.08 |  |  |  | 0.71 |  |  |  | 3.33 |

TABLE 12

| Composition | G Type | Mass % | H Type | Mass % | I Type | Mass % | J Type | Mass % | K Type | Mass % | L Type | Mass % |
|---|---|---|---|---|---|---|---|---|---|---|---|---|
| Colloidal silica | C4 | 18.5 | | | C3 | 10.0 | | | C2 | 18.5 | | |
| Organic-inorganic composite particles | | | | | | 0.5 | | | | | | |
| Organic particles | | | | | | | | | | 0.5 | | |
| Acidic compound | P4 | 0.4 | P4 | 0.6 | | | P1 | 0.4 | | | P4 | 1.6 |
| | | | Citric acid | 0.1 | | | Maleic acid | 1.0 | | | Quinolinic acid | 0.15 |
| | | | Maleic acid | 1.2 | | | | | | | Maleic acid | 0.8 |
| Basic compound | KOH | 0.7 | | | KOH | 0.5 | | | KOH | 0.6 | | |
| Benzotriazole | | | | 0.8 | | | | 0.8 | | | | 0.8 |
| pH | | 10.0 | | 1.5 | | 10.4 | | 2.1 | | 10.0 | | 1.5 |
| PA | | | | 1.00 | | | | 0.40 | | | | 1.60 |
| PO | | | | 1.30 | | | | 1.00 | | | | 0.95 |
| PA/PO | | | | 0.77 | | | | 0.40 | | | | 1.68 |

TABLE 13

| Composition | W Type | Mass % | X Type | Mass % | Y Type | Mass % | Z Type | Mass % |
|---|---|---|---|---|---|---|---|---|
| Colloidal silica | C5 | 18.5 | | | C6 | 18.5 | | |
| Organic-inorganic composite particles | | | | | | | | |
| Organic particles | | | | | | | | |
| Acidic compound | | | P4 | 0.8 | | | P4 | 0.8 |
| | | | P1 | 0.2 | | | Quinolinic acid | 0.2 |
| | | | Quinolinic acid | 0.2 | | | Maleic acid | 1.1 |
| | | | Maleic acid | 1.1 | | | | |
| Basic compound | KOH | 0.58 | | | KOH | 0.65 | | |
| Benzotriazole | | | | 0.8 | | | | 1.6 |
| pH | | 10.2 | | 1.7 | | 10.5 | | 1.6 |
| PA | | | | 1.00 | | | | 0.8 |
| PO | | | | 1.30 | | | | 1.30 |
| PA/PO | | | | 0.77 | | | | 0.62 |

5.3.17 Scratch and Flatness Evaluation Tests

Evaluation tests were conducted based on the test methods described in "5.2.3 Evaluation of scratches" and "5.2.4 Evaluation of flatness" using the chemical mechanical polishing aqueous dispersions (prepared by mixing the first composition and the second composition which had been allowed to stand for six months) of Examples 1 to 8. The results are shown in Table 14. In Table 14, a case where dishing or a fang occurred to no or only a small extent was indicated by "Good", and a case where dishing or a fang occurred to a small extent was indicated by "Fair". As is clear from the results shown in Table 14, scratches, dishing, and fangs were reduced when the ratio of the mass (PA) of the polyacrylic acid to the mass (OA) of the oxide other than the polyacrylic acid was 0.2 to 5.0. Scratches and fangs were not observed when the ratio of the mass (PA) of the polyacrylic acid to the mass (OA) of the oxide other than the polyacrylic acid was 0.5 to 3.0, but dishing occurred to a small extent. Scratches, dishing, and fangs were not observed when the ratio of the mass (PA) of the polyacrylic acid to the mass (OA) of the oxide other than the polyacrylic acid was 0.5 to 1.5.

TABLE 14

| | | | Example 1 | Example 2 | Example 3 | Example 4 | Example 5 | Example 6 | Example 7 | Example 8 |
|---|---|---|---|---|---|---|---|---|---|---|
| PA/OA in chemical mechanical polishing aqueous dispersion | | | 1.1 | 0.7 | 3.3 | 0.8 | 0.4 | 1.7 | 0.8 | 0.6 |
| Evaluation of scratches (per area) | | | 0 | 0 | 1 | 0 | 2 | 0 | 0 | 0 |
| Evaluation of flatness | Dishing | Angstrom | 30 | 50 | 120 | 80 | 150 | 100 | 80 | 90 |
| | | Evaluation | Good | Good | Fair | Good | Fair | Fair | Good | Good |
| | Fang | Angstrom | 80 | 60 | 280 | 100 | 320 | 120 | 80 | 60 |
| | | Evaluation | Good | Good | Fair | Good | Fair | Good | Good | Good |

5.4 Comparative Example 9

(a) Preparation of First Composition

The colloidal silica C2 in an amount equal to the amount of the colloidal silica C2 contained in the aqueous dispersion (A) prepared in 5.3.1 (a) was mixed with ammonium polyacrylate in an amount equal to the amount of the ammonium polyacrylate P2 contained in the aqueous dispersion (A). After the addition of ion-exchanged water, the pH of the mixture was adjusted to 3.5 by adding potassium hydroxide. After the addition of ion-exchanged water so that the total amount of the components was 100 mass %, the mixture was filtered through a filter having a pore size of 1 micrometer to obtain an aqueous dispersion (M) containing 18 mass % of colloidal silica. The colloidal silica in the aqueous dispersion (M) was uniformly dispersed. The average particle diameter of the colloidal silica in the aqueous dispersion (M) was 140 nm.

(b) Preparation of Second Composition

Quinolinic acid in an amount equal to the amount of the quinolinic acid contained in the aqueous dispersion (B) prepared in 5.3.1 (b) was mixed with benzotriazole in an amount equal to the amount of the benzotriazole contained in the aqueous dispersion (B). After the addition of the ammonium polyacrylate P1 in an amount equal to the amount of the ammonium polyacrylate P1 contained in the aqueous dispersion (B) and the ammonium polyacrylate P2 in an amount equal to the amount of the ammonium polyacrylate P2 contained in the aqueous dispersion (B), the mixture was stirred for 15 minutes. The pH of the mixture was adjusted to 9.2 by adding potassium hydroxide. After the addition of ion-exchanged water so that the total amount of the components was 100 mass %, the mixture was filtered through a filter having a pore size of 0.5 micrometers to obtain an aqueous solution (N).

(c) Evaluation of Dispersion State of First Composition and Second Composition Immediately after Preparation The dispersion state of the aqueous dispersion (M) and the aqueous solution (N) was uniform. The results are shown in Table 15.

(d) Evaluation of Dispersion State of First Composition and Second Composition which had been Allowed to Stand for One Week after Preparation The aqueous dispersion (M) and the aqueous solution (N) prepared as described above were allowed to stand for one week in a thermostat bath at 25° C. in an airtight container. Precipitates were observed in the aqueous dispersion (M) which had been allowed to stand for one week (i.e., the colloidal silica aggregated). The dispersion state of the aqueous dispersion (N) which had been allowed to stand for one week was uniform. The results are shown in Table 15.

TABLE 15

|  | Example 1 | | Comparative Example 9 | |
| --- | --- | --- | --- | --- |
|  | First composition | Second composition | First composition | Second composition |
| Type | A | B | M | N |
| pH | 9.2 | 3.5 | 3.5 | 9.2 |
| Dispersion (immediately after preparation) | Good | Good | Good | Good |
| Dispersion (one week after preparation) | Good | Good | Aggregation and precipitation | Good |

5.5 Comparative Examples 10 to 13

5.5.1 Comparative Example 10

(a) Preparation of First Composition

An aqueous dispersion (O) containing 18.5 mass % of the colloidal silica C6 was obtained in the same manner as in Example 1, except for changing the components as shown in Table 16. The colloidal silica C6 in the aqueous dispersion (O) was uniformly dispersed. The average particle diameter of the colloidal silica C6 in the aqueous dispersion (O) was 68 nm.

(b) Preparation of Second Composition

An aqueous solution (P) was obtained in the same manner as in Example 1, except for changing the components as shown in Table 16. The aqueous solution (P) did not contain poly(meth)acrylic acid.

(c) Preparation of Chemical Mechanical Polishing Aqueous Dispersion

The aqueous dispersion (O) and the aqueous solution (P) prepared as described above were allowed to stand for six months in a thermostat bath at 25° C. in an airtight container. The aqueous dispersion (O) and the aqueous solution (P) which had been allowed to stand for one week were mixed in equal amounts (mass). A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion. The pH of the chemical mechanical polishing aqueous dispersion thus prepared was 5.3.

5.5.2 Comparative Example 11

An aqueous dispersion (Q) (first composition) and an aqueous solution (R) were prepared in the same manner as in Comparative Example 10, except for changing the components as shown in Table 16. The pH of the aqueous dispersion (Q) (first composition) was 11.7. The aqueous dispersion (Q) (first composition) and the second composition (R) which had been allowed to stand for six months were mixed in equal amounts (mass) in a thermostat bath at 25° C. in an airtight container. A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion having a pH of 7.1.

5.5.3 Comparative Example 12

An aqueous dispersion (S) (first composition) and an aqueous solution (T) were prepared in the same manner as in Comparative Example 10, except for changing the components as shown in Table 16. The pH of the aqueous dispersion (S) (first composition) was 7.2. The aqueous dispersion (S) (first composition) and the second composition (T) w-hich had been allowed to stand for six months were mixed in equal amounts (mass) in a thermostat bath at 25° C. in an airtight container. A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion having a pH of 3.6.

5.5.4 Comparative Example 13

An aqueous dispersion (U) (first composition) and an aqueous solution (V) were prepared in the same manner as in Comparative Example 10, except for changing the components as shown in Table 16. The pH of the aqueous solution (V) (second composition) was 6.2. The aqueous dispersion (U) (first composition) and the second composition (V) which had been allowed to stand for six months were mixed in equal amounts (mass) in a thermostat bath at 25° C. in an airtight container. A dispersion medium was added to the mixture so that a specific dilution ratio was reached. A 30 mass % hydrogen peroxide aqueous solution in such an amount that the content of hydrogen peroxide in the resulting chemical mechanical polishing aqueous dispersion was 0.5 mass %, was added to the mixture to prepare a chemical mechanical polishing aqueous dispersion having a pH of 8.8.

TABLE 16

| | O | | P | | Q | | R | | S | | T | | U | | V | |
|---|---|---|---|---|---|---|---|---|---|---|---|---|---|---|---|---|
| | Type | Mass % | Type | Mass % | Type | Mass % | Type | Mass % | Type | Mass % | Type | Mass % | Type | Mass % | Type | Mass % |
| Colloidal silica | C6 | 18.5 | | | C7 | 18.5 | | | C6 | 18.5 | | | C5 | 18.5 | | |
| Organic-inorganic composite particles | | | | | | | | | | | | | | | | |
| Organic particles | | | | | | | | | | | | | | | | |
| Acidic compound | | | | | | | P4 | 0.4 | P4 | 0.1 | P4 | 0.3 | | | P4 | 0.12 |
| | | | | | | | Quinolinic acid | 0.2 | | | Maleic acid | 1.0 | | | Quinolinic acid | 0.01 |
| | | | Maleic acid | 0.95 | | | Maleic acid | 1.5 | | | | | | | | |
| Basic compound | KOH | 0.6 | | | KOH | 1.46 | | | KOH | 0.05 | KOH | 0.04 | KOH | 0.46 | KOH | 0.05 |
| Benzotriazole | | | | 0.8 | | | | 0.1 | | | | 0.8 | | | | 0.8 |
| pH | | 10.1 | | 1.6 | | 11.7 | | 1.7 | | 7.2 | | 3.0 | | 9.9 | | 6.2 |
| PA | | | | 0.00 | | | | 0.40 | | | | 0.40 | | | | 0.12 |
| PO | | | | 0.95 | | | | 1.70 | | | | 1.00 | | | | 0.01 |
| PA/PO | | | | 0.00 | | | | 0.24 | | | | 0.40 | | | | 12.00 |

5.5.5 Evaluation Tests for Polishing Rate, Scratches, and Flatness

Evaluation tests were conducted based on the test methods described in "5.2 Chemical mechanical polishing test" using the chemical mechanical polishing aqueous dispersions of Comparative Examples 10 to 13 immediately after preparation. The results are shown in Table 14. In Table 14, a case where a fang occurred to a large extent was indicated by "Poor" (i.e., unacceptable).

TABLE 17

|  |  |  | Comparative Example 10 | Comparative Example 11 | Comparative Example 12 | Comparative Example 13 |
|---|---|---|---|---|---|---|
| PA/OA in chemical mechanical polishing aqueous dispersion |  |  | 0 | 0.2 | 0.4 | 12.0 |
| Polishing rate | Copper layer | (Angstrom/min) | 350 | 820 | 780 | 70 |
|  | Tantalum nitride layer |  | 430 | 850 | 670 | 280 |
|  | PETEOS layer |  | 170 | 270 | 510 | 130 |
|  | BD layer |  | 15 | 30 | 30 | 20 |
| Evaluation of flatness | Dishing | (Angstrom) | 110 | 530 | 80 | 50 |
|  |  | Evaluation | Fair | Poor | Good | Good |
|  | Fang | (Angstrom) | 400 | 180 | 190 | 10 |
|  |  | Evaluation | Poor | Fair | Fair | Good |
| Evaluation of scratches (per area) |  |  | 2 | 5 | 1 | 23 |

When using the chemical mechanical polishing aqueous dispersion of Comparative Example 10, scratches and dishing could be reduced within the allowable range, but fangs could not be reduced.

When using the chemical mechanical polishing aqueous dispersions of Comparative Examples 11 to 13, poor results were obtained since the pH of the first composition or the second composition was outside the range of the present invention.

In Comparative Example 11, in which the pH of the first composition exceeded 11.0, the pH of the chemical mechanical polishing aqueous dispersion obtained by mixing the first composition and the second composition exceeded 6.0. As a result, a sufficient polishing rate could not be obtained for the PETEOS film so that an excellent polished surface could not be obtained.

In Comparative Example 12, since the pH of the first composition was less than 8.0, aggregation of the abrasive grains in the first composition was observed six months after preparation. This makes it impossible to apply the chemical mechanical polishing aqueous dispersion of Comparative Example 12 due to poor storage stability.

In Comparative Example 13, in which the pH of the second composition exceeded 5.0, the pH of the chemical mechanical polishing aqueous dispersion obtained by mixing the first composition and the second composition exceeded 6.0. As a result, a sufficient polishing rate could not be obtained for the copper film, the tantalum nitride film, and the PETEOS film. Moreover, an excellent polished surface could not be obtained due to a large number of scratches (i.e., unacceptable).

5.6 Conclusion

As is clear from the above results, the effects of the invention can be achieved using a chemical mechanical polishing aqueous dispersion preparation set including the first composition which includes colloidal silica and a basic compound and has a pH of 8.0 to 11.0 and a second composition which includes poly(meth)acrylic acid and an organic acid (preferably a compound having a pKa value of three or less or having a heterocyclic six-membered ring containing at least one nitrogen atom) having two or more carbonyl groups other than the poly(meth)acrylic acid and has a pH of 1.0 to 5.0.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A chemical mechanical polishing aqueous dispersion preparation set comprising:
   a first composition comprising (a) colloidal silica having an average primary particle diameter of 15 to 40 nm, (b) a basic compound, and (c) water, wherein the first composition has a pH of 8.0 to 11.0; and
   a second composition comprising (d) poly(meth)acrylic acid, (e) an organic acid having two or more carbonyl groups other than the poly(meth)acrylic acid, and (f) water, wherein the second composition has a pH of 1.0 to 5.0.

2. The chemical mechanical polishing aqueous dispersion preparation set as defined in claim 1, wherein the organic acid having two or more carbonyl groups has a pKa value of three or less.

3. The chemical mechanical polishing aqueous dispersion preparation set as defined in claim 1, wherein the organic acid having two or more carbonyl groups is at least one organic acid selected from maleic acid, quinolinic acid, and citric acid.

4. The chemical mechanical polishing aqueous dispersion preparation set as defined in claim 1, wherein the basic compound is potassium hydroxide or ammonia.

5. The chemical mechanical polishing aqueous dispersion preparation set as defined in claim 1, wherein at least one of the first composition and the second composition includes benzotriazole.

6. The chemical mechanical polishing aqueous dispersion preparation set as defined in claim 1, further including a third composition which includes at least an oxidizing agent.

7. A method of preparing a chemical mechanical polishing aqueous dispersion comprising:
   mixing the first composition with the second composition of the chemical mechanical polishing aqueous dispersion preparation set of claim 1, to obtain a chemical mechanical polishing aqueous dispersion having a pH of 3.5 to 6.0.

8. The method of preparing a chemical mechanical polishing aqueous dispersion as defined in claim 7, wherein a mass ratio PA/OA of a mass PA of the poly(meth)acrylic acid to a mass OA of the organic acid having two or more carbonyl groups included in the chemical mechanical polishing aqueous dispersion is 0.2 to 5.0.

9. The method of preparing a chemical mechanical polishing aqueous dispersion as defined in claim 7, wherein the organic acid having two or more carbonyl groups has a pKa value of three or less.

10. The method of preparing a chemical mechanical polishing aqueous dispersion as defined in claim 7, wherein the organic acid having two or more carbonyl groups is at least one organic acid selected from maleic acid, quinolinic acid, and citric acid.

11. The method of preparing a chemical mechanical polishing aqueous dispersion as defined in claim 7, wherein the basic compound is potassium hydroxide or ammonia.

12. The method of preparing a chemical mechanical polishing aqueous dispersion as defined in claim 7, wherein at least one of the first composition and the second composition includes benzotriazole.

13. The method of preparing a chemical mechanical polishing aqueous dispersion as defined in claim 7, wherein the first composition, the second composition, and a third composition which includes at least an oxidizing agent are mixed to prepare the chemical mechanical polishing aqueous dispersion.

14. The chemical mechanical polishing aqueous dispersion preparation set as defined in claim 1, wherein a weight average molecular weight of the poly(meth)acrylic acid is 1,000,000 to 5,000,000.

* * * * *